(12) United States Patent
Zyglowicz et al.

(10) Patent No.: US 11,055,450 B2
(45) Date of Patent: Jul. 6, 2021

(54) INDUSTRIAL ASSET HEALTH MODEL UPDATE

(71) Applicant: ABB Power Grids Switzerland AG, Baden (CH)

(72) Inventors: Steven Thomas Zyglowicz, Leesburg, VA (US); Karen J. Smiley, Raleigh, NC (US); Shakeel M. Mahate, Raleigh, NC (US); Chihhung Hou, Morrisville, NC (US)

(73) Assignee: ABB Power Grids Switzerland AG, Baden (CH)

( * ) Notice: Subject to any disclaimer, the term of this patent is extended or adjusted under 35 U.S.C. 154(b) by 830 days.

(21) Appl. No.: 14/142,027

(22) Filed: Dec. 27, 2013

(65) Prior Publication Data
US 2014/0365191 A1   Dec. 11, 2014

Related U.S. Application Data

(60) Provisional application No. 61/833,409, filed on Jun. 10, 2013.

(51) Int. Cl.
*G06F 30/20* (2020.01)
*G06Q 10/00* (2012.01)
(Continued)

(52) U.S. Cl.
CPC .............. *G06F 30/20* (2020.01); *G06Q 10/04* (2013.01); *G06Q 10/067* (2013.01);
(Continued)

(58) Field of Classification Search
CPC ........... G06Q 10/0635; G06Q 10/0637; G06Q 10/04; G06Q 10/06; G06Q 10/20; G06Q 50/06

See application file for complete search history.

(56) References Cited

U.S. PATENT DOCUMENTS 6,836,539 B2 * 12/2004 Katou ................ G05B 23/0275
                                                       379/106.01
7,103,509 B2 *  9/2006 Shah ........................ G01D 1/00
                                                       700/52

(Continued)

FOREIGN PATENT DOCUMENTS

CN          102313577 A      1/2012
CN          102324067 A      1/2012

OTHER PUBLICATIONS

"How Engineers Can Conduct Cost-Benefit Analysis for PHM Systems," by Jeffrey Banks, et al., IEEEAC paper #1363, Version 3, updated Nov. 23, 2004.*

(Continued)

*Primary Examiner* — Tyler W Knox

(74) *Attorney, Agent, or Firm* — Slater Matsil, LLP

(57) ABSTRACT

Among other things, one or more techniques and/or systems are provided for updating a model for generating a health profile of an industrial asset based upon data pertaining to the industrial asset. The health profile comprises a maintenance plan(s), which respectively comprise one or more recommended maintenance actions to be performed with respect to the industrial asset during a prediction period. The model may be periodically and/or intermittently updated based upon a comparison between the recommended maintenance actions and actual events of the industrial asset during the prediction period. Moreover, in some embodiments, different models may be selected for generating future health profiles of the industrial asset based upon a comparison between the recommended maintenance actions and actual events of the industrial asset during the prediction period.

22 Claims, 10 Drawing Sheets

(51) Int. Cl.
*G06Q 10/06* (2012.01)
*G06Q 10/04* (2012.01)
*G06Q 50/06* (2012.01)

(52) U.S. Cl.
CPC ....... *G06Q 10/06311* (2013.01); *G06Q 10/20* (2013.01); *G06Q 50/06* (2013.01); *Y02P 90/80* (2015.11)

(56) References Cited

U.S. PATENT DOCUMENTS

| | | | | |
|---|---|---|---|---|
| 7,409,371 | B1* | 8/2008 | Heckerman | G06N 20/00 706/12 |
| 7,478,071 | B2 | 1/2009 | Kadambe | G06K 9/6217 705/35 |
| 8,423,397 | B2* | 4/2013 | Sitton | G06Q 10/04 705/7.28 |
| 8,571,911 | B1* | 10/2013 | Meyer | G06Q 10/06 705/7.12 |
| 8,615,374 | B1* | 12/2013 | Discenzo | G01D 21/02 702/127 |
| 9,138,786 | B2* | 9/2015 | McKay | B08B 9/055 |
| 9,599,653 | B2* | 3/2017 | Kim | G01N 33/0004 |
| 2002/0065698 | A1* | 5/2002 | Schick | G06Q 10/063 705/7.36 |
| 2002/0078403 | A1* | 6/2002 | Gullo | G06F 11/008 714/37 |
| 2002/0114433 | A1* | 8/2002 | Katou | G07C 5/008 379/106.01 |
| 2002/0161558 | A1* | 10/2002 | Georges | G05B 23/0245 702/189 |
| 2002/0166973 | A1* | 11/2002 | Frederick | G01V 5/06 250/361 R |
| 2003/0055666 | A1* | 3/2003 | Roddy | G06Q 10/06395 705/305 |
| 2003/0061004 | A1* | 3/2003 | Discenzo | G05B 13/024 702/182 |
| 2003/0083756 | A1* | 5/2003 | Hsiung | G05B 23/0286 700/28 |
| 2004/0158772 | A1* | 8/2004 | Pan | H02J 3/00 714/14 |
| 2005/0007106 | A1* | 1/2005 | Goldfine | G01N 27/9046 324/228 |
| 2005/0141682 | A1* | 6/2005 | Wells | H02J 3/00 379/90.01 |
| 2005/0182739 | A1* | 8/2005 | Dasu | G06Q 10/00 706/47 |
| 2005/0216503 | A1* | 9/2005 | Chariot | G16H 10/60 |
| 2006/0004499 | A1* | 1/2006 | Trego | G07C 5/085 701/31.4 |
| 2006/0064456 | A1* | 3/2006 | Kalthoff | H04L 67/1095 709/201 |
| 2007/0021915 | A1* | 1/2007 | Breed | G08G 1/164 701/301 |
| 2007/0056374 | A1* | 3/2007 | Andrews | G01N 29/4418 73/628 |
| 2007/0192065 | A1* | 8/2007 | Riggs | H04L 41/147 702/189 |
| 2008/0021604 | A1* | 1/2008 | Bouvier | G06Q 10/06 701/29.5 |
| 2008/0082345 | A1* | 4/2008 | Greiner | G06Q 10/06 705/305 |
| 2008/0188973 | A1* | 8/2008 | Filev | G05B 23/0283 700/110 |
| 2008/0262736 | A1* | 10/2008 | Thigpen | E21B 43/128 702/9 |
| 2008/0319811 | A1* | 12/2008 | Casey | G06Q 10/06311 705/7.13 |
| 2009/0037206 | A1* | 2/2009 | Byrne | G06Q 10/06 705/305 |
| 2009/0055070 | A1* | 2/2009 | De | F02C 9/00 701/100 |
| 2009/0088875 | A1* | 4/2009 | Baier | G05B 19/41865 700/83 |
| 2009/0089225 | A1* | 4/2009 | Baier | G06Q 10/06 706/12 |
| 2009/0094174 | A1* | 4/2009 | Kussmaul | G06F 16/283 706/12 |
| 2009/0113049 | A1* | 4/2009 | Nasle | G05B 19/0428 709/224 |
| 2009/0210081 | A1* | 8/2009 | Sustaeta | H04L 67/125 700/99 |
| 2009/0222307 | A1* | 9/2009 | Beaver | G06Q 10/06 705/7.25 |
| 2009/0228129 | A1* | 9/2009 | Moyne | G05B 19/41865 700/102 |
| 2009/0271235 | A1* | 10/2009 | Kubota | G06Q 10/06 705/7.11 |
| 2010/0100248 | A1* | 4/2010 | Minto | G05B 17/02 700/287 |
| 2010/0153156 | A1* | 6/2010 | Guinta | G06Q 10/0635 705/7.28 |
| 2010/0198635 | A1* | 8/2010 | Pirtle | G06Q 10/04 705/7.41 |
| 2010/0268391 | A1* | 10/2010 | Anderson | A01G 25/167 700/284 |
| 2010/0286841 | A1* | 11/2010 | Subbloie | G06F 1/3203 700/295 |
| 2011/0227558 | A1* | 9/2011 | Mannion | B82Y 30/00 324/71.1 |
| 2011/0276498 | A1* | 11/2011 | Madhok | G06Q 30/06 705/302 |
| 2011/0282508 | A1* | 11/2011 | Goutard | H04L 63/20 700/293 |
| 2011/0283145 | A1* | 11/2011 | Nemecek | G06F 11/008 714/37 |
| 2012/0116696 | A1* | 5/2012 | Wank | G01R 31/42 702/58 |
| 2012/0123705 | A1* | 5/2012 | Drahm | G01F 1/8413 702/54 |
| 2012/0143565 | A1* | 6/2012 | Graham, III | G05B 23/0237 702/181 |
| 2012/0290104 | A1* | 11/2012 | Holt | G06Q 10/00 700/29 |
| 2013/0041705 | A1* | 2/2013 | Hampapur | G06Q 10/10 705/7.12 |
| 2013/0151423 | A1* | 6/2013 | Schmidt | G06F 16/215 705/306 |
| 2014/0053626 | A1* | 2/2014 | Jeffrey | G01N 33/2841 73/19.1 |
| 2014/0200952 | A1* | 7/2014 | Hampapur | G06Q 10/06 705/7.28 |
| 2014/0245814 | A1* | 9/2014 | Montanari | G01N 33/28 73/19.1 |
| 2014/0330600 | A1* | 11/2014 | Candas | G06Q 10/06313 705/7.12 |
| 2014/0330609 | A1* | 11/2014 | Candas | G06Q 10/06313 705/7.23 |
| 2014/0365191 | A1* | 12/2014 | Zyglowicz | G06Q 10/20 703/7 |
| 2014/0365271 | A1 | 12/2014 | Smiley et al. | |
| 2015/0379429 | A1* | 12/2015 | Lee | G06N 20/00 706/11 |

OTHER PUBLICATIONS

"Handbook of Maintenance Management and Engineering," edited by Mohamed Ben-Daya, et al., available on Springer, 2009.*
Extended EP Search Report cited in EP Application No. 14171453.5 dated Aug. 1, 2014, 8 pgs.
"Current status of machine prognostics in condition-based maintenance: a review", Ying Peng, Ming Dong and Ming Jian Zuo, Jan. 6, 2010, The International Journal of Advanced Manufacturing Technology, vol. 50, Issue 1-4 , pp. 297-313.
Non-Final Office Action cited in U.S. Appl. No. 14/090,154 dated Sep. 29, 2015, 48 pgs.

(56) References Cited

OTHER PUBLICATIONS

Reply Non-Final Office Action cited in U.S. Appl. No. 14/090,154 dated Dec. 29, 2015, 20 pgs.
Final Office Action cited in U.S. Appl. No. 14/090,154 dated Mar. 9, 2016, 44 pgs.
Response after Final Office Action cited in U.S. Appl. No. 14/090,154 dated May 9, 2016, 11 pgs.
Advisory Action cited in U.S. Appl. No. 14/090,154 dated May 20, 2016, 3 pgs.
Reply Final Office Action cited in U.S. Appl. No. 14/090,154 dated Jun. 14, 2016, 12 pgs.
EP Communication cited in EP Application No. 14171453.5 dated Jul. 15, 2016, 7 pgs.
Int. Preliminary Report cited in PCT Application No. PCT/US2014/041663 dated Dec. 15, 2015, 8 pgs.
Int. Search Report cited in PCT Application No. PCT/US2014/041663 dated Sep. 1, 2014, 13 pgs.
Office Action for CN 201410254005.7, dated Nov. 2, 2018, with English language translation, 19 pages.
"The Basics of Arc Flash," by Cameron G. Clark, General Electric Industrial Solutions, available at <https://www.geindustrial.com/sites/geis/tiles/gallery/The-Basics-of-Arc-Flash-Article_GE_Industrial_Solutions_0.pdf>, accessed Nov. 1, 2016.
"SCADA Systems" white paper, by Schneider Electric Telemetry & Remote SCADA Solutions, Mar. 2012, available at <http://www.schneider-electric.com/solutions/ww/EN/med/20340568/application/pdf/1485_se-whitepaper-letter-scadaoverview-v0005.pdf>, accessed Apr. 27, 2017.

\* cited by examiner

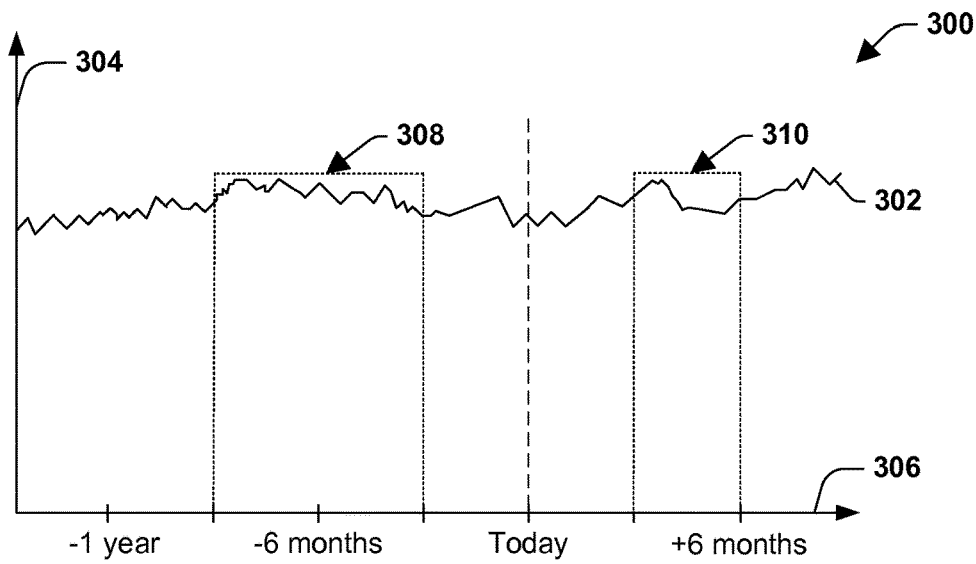
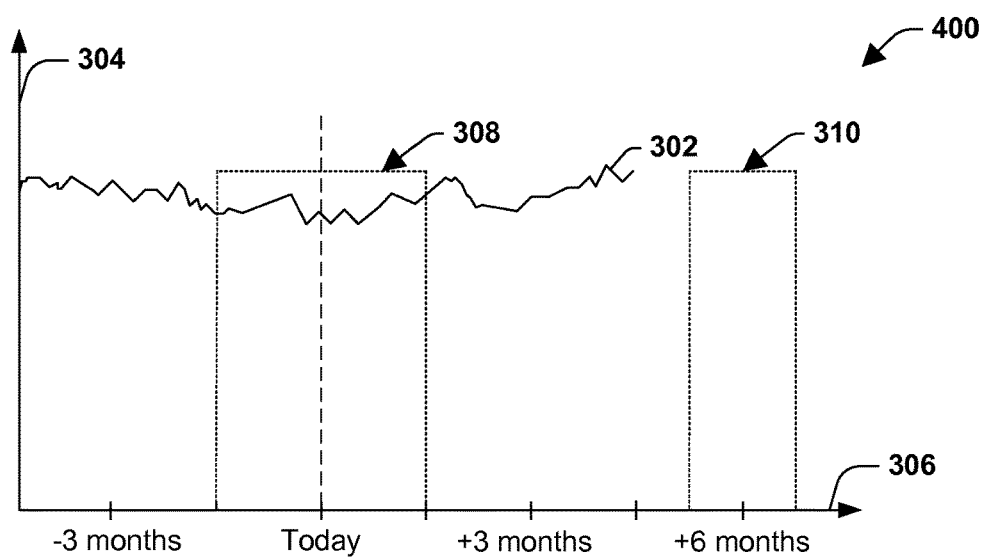
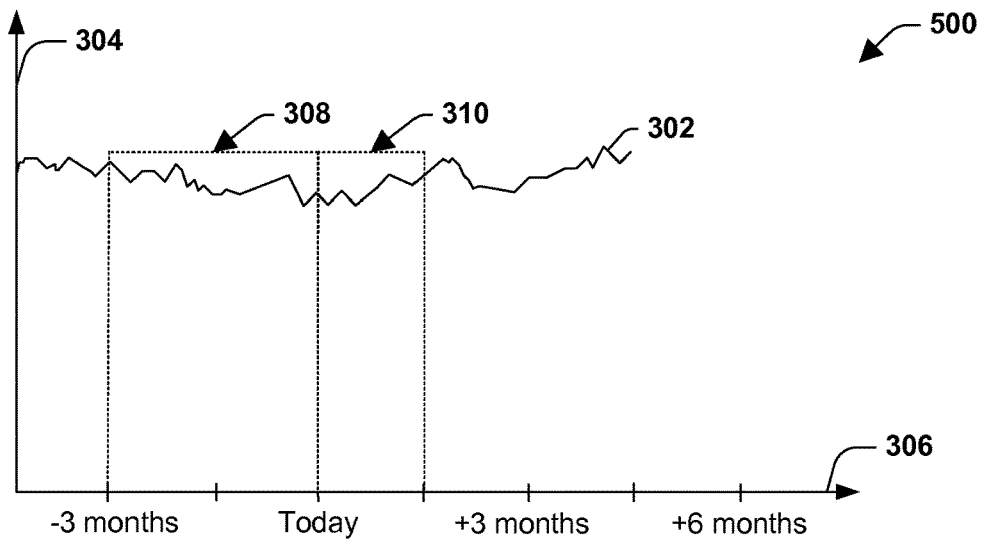

INDUSTRIAL ASSET HEALTH MODEL UPDATE

CROSS REFERENCE TO RELATED APPLICATIONS

This application claims the benefit of U.S. Provisional Application 61/833,409, filed on Jun. 10, 2013 and entitled "Model Development and Updating," which is incorporated herein by reference.

BACKGROUND

The present application relates to industrial assets and more particularly to systems and/or techniques for selecting and/or updating models configured to provide maintenance recommendations for industrial assets. Such maintenance recommendations can include, among other things, operational changes and/or physical changes to the industrial asset and/or to an interrelated system to improve performance, increase longevity of the industrial asset, and/or satisfy other specified business objectives. While the systems and/or techniques find particular application to industrial assets of a power system, they may also relate to other applications where models can be utilized to provide maintenance recommendations.

A power system comprises a fleet of industrial assets comprising electrical equipment and non-electrical equipment used to generate, supply, transmit, and/or consume or convert electrical power. Industrial assets of such a power system are usually designed to last decades and perform a critical role in supplying power to consumers. Accordingly, a substantial amount of resources (e.g., time, money, staffing, etc.) are typically dedicated to maintenance planning and early detection of possible failures.

Often, a maintenance schedule is devised for an industrial asset based upon a manufacturer's recommended maintenance schedule, and this maintenance schedule may be revised according to events (e.g., usage and/or performance of the industrial asset, trouble reports, outage reports, and/or inspections performed on the industrial asset). By way of example, a yearly inspection may be performed on a distribution sub-station to identify early signs of fatigue, excessive wear, and/or reduced performance. Based upon these inspections and/or other information about the industrial asset (e.g., such as data yielded from sensors associated with the industrial asset), the maintenance schedule may be updated to take into account environmental conditions, operating conditions, and/or other conditions associated with the industrial asset.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to an aspect, a method is provided. The method comprises generating, using a model, a health profile of an industrial asset based upon data generated during an assessment period and indicative of the industrial asset. The health profile comprises at least one maintenance plan providing one or more maintenance actions that are recommended to be performed with respect to the industrial asset during a prediction period. The method also comprises receiving data generated during the prediction period and indicative of the industrial asset and updating the model (e.g., based upon a comparison of the data generated during the prediction period with the health profile).

According to another aspect, a system is provided. The system comprises a profile generation component configured to generate a health profile of an industrial asset using a model. The health profile comprises at least one maintenance plan providing one or more maintenance actions that are recommended to be performed with respect to the industrial asset during a prediction period. The system also comprises a model update component configured to update the model (e.g., based upon a comparison of the health profile with data generated during the prediction period and indicative of the industrial asset).

According to yet another aspect, a computer readable medium comprising computer executable instructions that when executed perform a method is provided. The method comprises generating, using a model, a health profile of an industrial asset based upon data generated during an assessment period and indicative of the industrial asset. The health profile comprises at least one maintenance plan providing one or more maintenance actions that are recommended to be performed with respect to the industrial asset during a prediction period. The method also comprises receiving data generated during the prediction period and indicative of the industrial asset and updating the model (e.g., based upon a comparison of the data generated during the prediction period with the health profile).

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 3 illustrates an example graph describing an assessment period and a prediction period.

FIG. 4 illustrates an example graph describing an assessment period and a prediction period.

FIG. 5 illustrates an example graph describing an assessment period and a prediction period.

DETAILED DESCRIPTION

Figure 1:
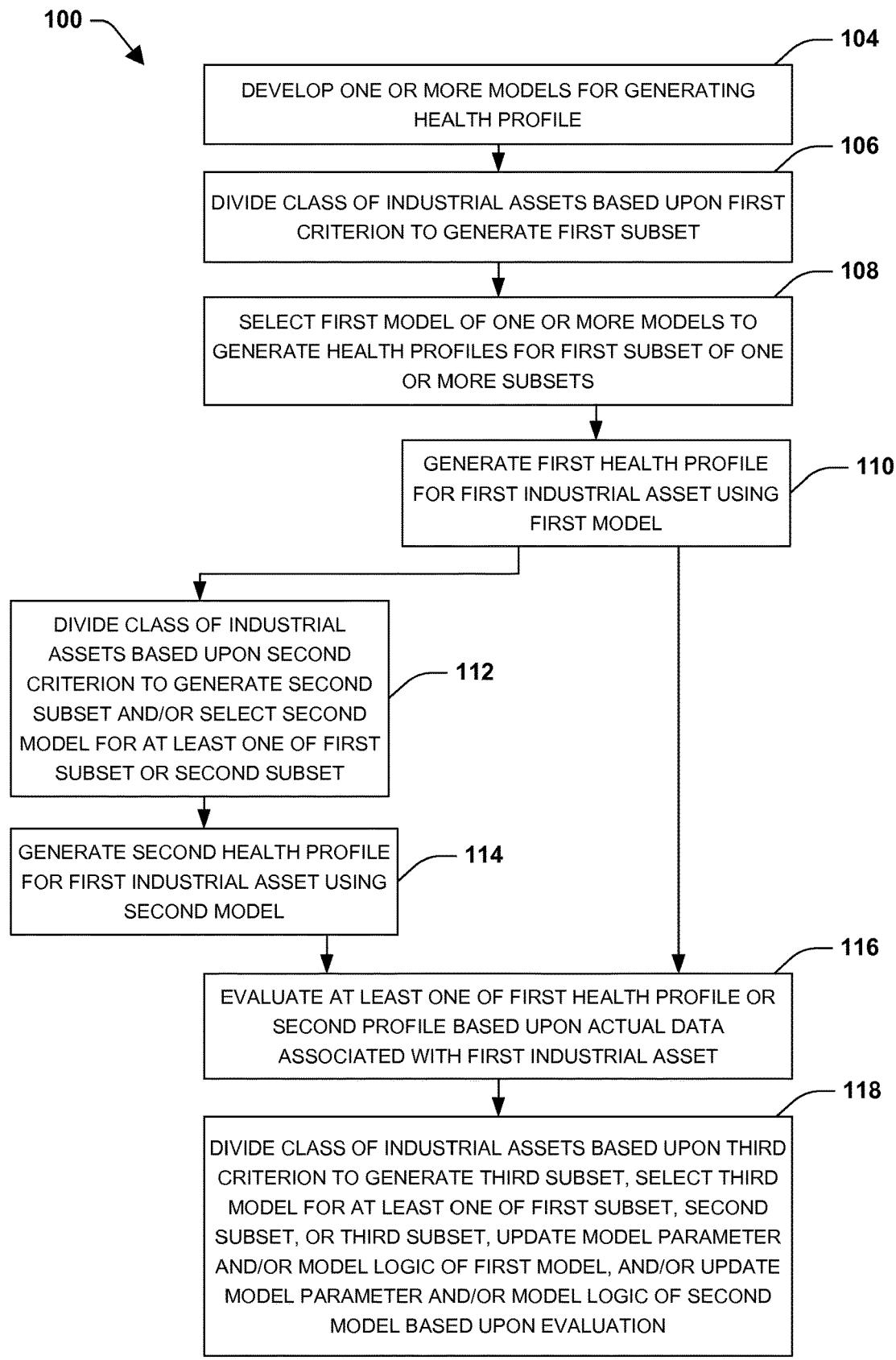
FIG. 1 is a flow diagram illustrating an example method according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. In other instances, structures and devices are illustrated in block diagram form in order to facilitate describing the claimed subject matter.

As used herein, a confidence profile describes a confidence in the probability (e.g., value, accuracy, etc.) of an event occurring or not occurring. Such an event may include a forecasted condition, a forecasted impact of the condition, a forecasted maintenance recommendation (e.g., to remedy a condition and/or to alter an impact of the condition), etc. The confidence profile may be based upon the type of data from which the probability was determined, a quality of the data (e.g., an accuracy of a sensor or other tool utilized to generate the data), a quantity of data available from which to compute the probability, and/or how strongly that data correlates with the outcome (e.g., how strongly it can be inferred from the data that the recommended maintenance action is necessary during a prediction period, etc.). The confidence profile may be a numerical score (e.g., 90% confidence in the recommended maintenance action), may be a range (e.g., 85-92% confidence in the recommended maintenance action), may follow a distribution function, and/or may describe a cone of uncertainty (e.g., where there is a first confidence associated with the likelihood of a condition occurring within the next 3 months if a recommended maintenance action is not performed and a second confidence associated with the likelihood of a condition occurring with the next 6 months if the recommended maintenance action is not performed), for example.

Moreover, industrial asset is used herein to describe a piece of equipment, element thereof, and/or a group of equipment logically and/or physically assembled together to form a production unit. Examples of such industrial assets may include a transformer, bushing, circuit breaker, substation (e.g., comprising one or more transformers and/or one or more circuit breakers), transmission tower, power generator, etc. The industrial assets may also include auxiliary items which are used to access, restrict access, and/or service the equipment, such as fences, access roads, etc.

A power system comprises thousands if not millions of industrial assets (e.g., including electrical and non-electrical equipment) which require maintenance to operate efficiently and/or to reduce the probability or impact of a failure. Electrical equipment of such a system may include, among other things, turbines, transformers, circuit breakers, capacitors, voltage regulators, batteries, and power lines, for example. Non-electrical equipment of such a system may include, among other things, storage cabinets, poles, and transmission towers, for example.

Utility providers and other entities routinely assess the health of such industrial assets via inspections, history reports (e.g., describing the operating history, event history, etc. of an industrial asset), and/or sensors associated with the industrial asset. Over time, a data record of the industrial record is formed which comprises data pertaining to sensor readings, inspections, outages, maintenance, operating conditions, environmental conditions, heat run tests, design specifications, etc.

Recently, health models have been developed that are configured to analyze at least a portion of a data record of an industrial asset to generate a health profile for an industrial asset and/or for a fleet of industrial assets. The health profile may include information regarding the current health and/or expected future health of the industrial asset and/or recommended maintenance actions (e.g., for today or in the future). In some embodiments, such a health profile also describes the expected health consequences to an industrial asset if a recommended maintenance action is performed and/or is not performed and/or describes an expected cost (e.g., in term of money, labor, etc.) associated with the recommended maintenance action. In this way, the health profile provides information that can assist in resource planning and/or budgetary forecasting, for example.

While these models are useful, the models typically are not developed to discriminate between various subsets of a class of industrial asset (e.g., where subsets may be based upon manufacturer, voltage class, operating climate, operating performance (e.g., load/capacity ratio), etc.) and/or are not updated (e.g. fine-tuned) based upon actual predictive accuracy for various subsets, for example.

Accordingly, systems and/or techniques are described for identifying subsets of industrial assets (e.g., where a subset corresponds to a group of industrial assets that share a common set of characteristics), selecting a model that (e.g., best) predicts maintenance actions for the subset of industrial assets, using the model to make predictions and/or maintenance recommendations for a prediction period based upon data acquired during one or more assessment periods, and/or updating the model based upon analysis of the data (e.g., acquired during the prediction period) and/or based upon comparing the predictions to data acquired during prediction periods. In some embodiments, the identifying, selecting, and/or updating are performed iteratively to improve the overall benefit of the recommended maintenance actions (e.g., to improve the effectiveness of the recommended maintenance actions) for a given industrial asset and/or fleet of assets and/or to achieve some other business objective (e.g., a specified prediction accuracy, a specified confidence in a forecast, a specified forecasting period, etc.). For example, a model may comprise a set of data inputs, which may change over time based upon new discoveries (e.g., newly discovered trends/patterns in the data) and/or cost considerations of an entity. By way of example, a first data input may be resource intensive to acquire (e.g., to acquire the data requires frequent field-visits by a technician, requires a costly sensor, etc.). Over time, as data is analyzed, it may be determined that disregarding the first data input from consideration has little to no impact on the predictive accuracy and/or on the confidence in a prediction and that the expense associated with acquiring the first data input is not worth the benefit to the model. Thus, the model may be updated to remove the first data input from consideration and/or to remove a maintenance recommendation to acquire the first data input. As a further example, as data is analyzed, it may be determined that a maintenance action has relatively low beneficial impact on the long-term health and/or performance of the asset, or even that the maintenance action may be detrimental to the industrial asset, and thus the model may be updated to adjust the conditions and/or reduce the frequency and/or adjust the confidence profile with which that particular maintenance action is recommended. As yet another example, it may be determined that under certain timings or conditions a particular maintenance action is more effective in practice than was originally determined, and thus the model may be updated to adjust the conditions and/or increase the frequency and/or raise the confidence profile with which that particular maintenance action is recommended.

It may be appreciated that while the instant application sometimes refers to features singularly, in some applications, multiple (e.g., similarly configured) features may be used to derive a product and/or may be output from a product. By way of example, multiple models may be utilized to generate a health profile of an industrial asset. As another example, a single model may be utilized to generate multiple health profiles of an industrial asset. As still another example, respective health profiles may comprise one or more maintenance plans (e.g., where a first maintenance plan included within a health profile is generated by a first model and a second maintenance plan included within the health profile is generated by a second model and/or where the first maintenance plan and the second maintenance plan are generated by the same model). Further, the techniques and/or systems described herein may be utilized to update a single model or a plurality of models.

Referring to FIG. 1, an example method 100 according to some embodiments is illustrated. At 104 in the example method 100, one or more models are developed for generating health profiles. The models may be generated programmatically (e.g., based upon historical data yielded from one or more industrial assets of a class to which the model relates) and/or by subject matter experts, for example. By way of example, machine learning algorithms may utilize the data record of one or more industrial assets to develop a model(s) that generates a health profile(s) describing the health of the industrial asset and/or providing a maintenance plan(s) comprising one or more maintenance actions that are recommended to be performed during the prediction period to improve, maintain, and/or lessen a decline in the health of the industrial asset.

At 106 in the example method 100, a class of industrial assets is divided into one or more subsets, including a first subset, based upon one or more criteria (e.g., where class may be defined as a group of industrial assets configured to perform a similar function). Such criteria may include voltage class, operating environment, manufacturer, output production, loading capacity, age, etc. The initial division of industrial assets may be based upon user specified criteria, may be programmatically selected (e.g., based upon model parameters of a model), and/or may be random. For example, a class of industrial assets may be sub-divided into one or more subsets based upon default criteria, such as voltage class, during an initial division. Subsequently, the criteria used to sub-divide the class of industrial assets may be updated based upon differences between forecasts included in the health profile and actual events that occur with respect to the industrial asset during the prediction period (e.g., also referred to as forecasted period, forecast window, etc.), for example.

It is to be appreciated that while the example method 100 illustrates the division as occurring after the development of the one or more models, in some embodiments, the division at 106 is independent of the development at 104. In still other embodiments, the division at 106 occurs before the development at 104 (e.g., and the development is a function of the criteria used to divide the class of industrial assets).

At 108, a first model of the one or more models is selected to generate health profiles for the first subset of industrial assets. The first model may be selected at random, may be user specified, and/or may be based upon the criteria used to divide the class of industrial assets into subsets at 106. By way of example, a user may specify that health profiles for industrial assets of respective subsets are to be generated using a first model (e.g., such as a flow chart model). As will be described in more detail below, based upon the health profiles that are produced by the first model (e.g., the confidences in the forecast) and/or based upon differences between the forecasts of the first model and actual events during the forecasted period, for example, the model that is used to generate a health profile of a given industrial asset may change over time.

As another example, the first model may be selected based upon the criteria used to divide industrial assets into subsets. For example, it may be believed that the first model is more accurate at forecasting transformers manufactured by a first manufacturer and that a second model is more accurate at forecasting transformers manufactured by a second manufacturer. Accordingly, if transformers are divided at 106 based upon manufacturer, the first model may be selected to generate health profiles for the first subset of transformers, which are manufactured by the first manufacturer, and the second model may be selected to generate health profiles for a second subset of transformers, which are manufactured by the second manufacturer. Again, as will be described below, the model that is selected for a particular subset may change over time based upon changes to the criteria used to divide a class of industrial assets and/or changes in the understanding of the interplay between manufacturer and model (e.g., over time it may become evident that the accuracy of the model is not as manufacturer dependent as once believed), for example.

At 110 in the example method 100, the first model is used to generate a first health profile for a first industrial asset of the first subset. The first health profile describes the expected health of the first industrial asset during a prediction period (e.g., which may be user specified or may be specified as a model parameter). By way of example, upon a triggering event (e.g., user initiation, time period lapsed, budgetary event, operating event, etc.), at least a portion of the data record of the first industrial asset may be provided to the first model, which analyzes the portion of the data record to generate a first health profile of the first industrial asset. The first health profile may describe, among other things, the current health of the first industrial asset, one or more maintenance action plan(s) that are recommended to be performed during a prediction period (e.g., during a forecast window), an expected health of the first industrial asset during the prediction period and/or associated consequences if the maintenance actions are or are not performed, and/or an expected cost associated with the maintenance actions. At least some of the predictions and/or recommendations included with the health profile may be associated with a confidence profile describing the confidence in the prediction(s) and/or recommendation(s) (e.g., forecast).

At 112 in the example method 100, the class of industrial assets may be re-divided into a second set of subsets based upon second criteria (e.g., where based upon the re-division, the first industrial asset is part of a second subset) and/or a second model may be selected to generate health profiles for at least one of the first subset or the second subset of industrial assets. By way of example, the degree of confidence in the overall health profile and/or in one or more predictions contained therein may be less than a specified threshold. As another example, a confidence in a suitability of a recommendation and/or an expected range of cost-effectiveness of the recommendation may be less than desired. Accordingly, the criteria used to sub-divide a class of industrial assets and/or the selected model may be updated in an effort to improve the confidence in the overall health profile and/or in the one or more predictions and/or to improve the suitability of the recommendation and the cost-effectiveness of the recommendation. By way of example, a second model may be selected for the first subset of industrial assets based upon the first health profile (e.g., and/or based upon the inability to achieve a desired confidence, desired cost-effectiveness, etc. using the first health profile), and the data record of the first industrial asset may be provided to the second model to generate a second health profile for the first industrial asset using the second model at 114. In some embodiments, such a process may continue until desired stopping criteria are satisfied (e.g., respective models in a data store have been tested, the confidence profile of the health profile satisfies specified thresholds, etc.).

At 116 in the example method 100, the first health profile and/or the second health profile are evaluated based upon actual data associated with the first industrial asset that was collected during a prediction period of the first health profile and/or second health profile. Such actual data may include information about how often and/or over what period the health of the industrial asset was evaluated during the prediction period, maintenance actions performed during the prediction period, operating conditions during the prediction period, and/or other information that may be used to assess the reliability and/or accuracy of the first health profile and/or the second health profile. During such an evaluation, differences and/or similarities between the predictions and actual events occurring within the prediction period (e.g., forecast window) are identified. For example, data collected during the prediction period (e.g., such as maintenance records, sensor readings, etc.) may be acquired to determine if a recommended maintenance action was performed and/or what impact performing or not performing the recommended maintenance action had on the health profile of the industrial asset (e.g., which may be compared with the forecasted impact listed in the first health profile and/or second health profile). As a further example, data may be acquired to determine if an alternative maintenance action was performed (or if no maintenance action was performed), and to assess the impact of the alternative maintenance action and/or the lack of maintenance action. In some embodiments, data may also be acquired to determine if the recommended maintenance action was performed with different characteristics (e.g., personnel, parts, timing, operating circumstances, etc.) than recommended.

At 118 in the example method 100, the actual data acquired at 116 and/or the differences and/or similarities between the predictions and the actual events may be used to update model logic and/or model parameters of the first model and/or second model, to update criteria used to divide the class of industrial assets into subsets (e.g., where based upon the re-division, the first industrial asset is part of a third subset), and/or to select a third model for generating health profiles for at least one of the first subset, the second subset, and/or the third subset. In this way, model logic, model parameters, the type of model used, and/or the criteria for dividing industrial assets may be updated (e.g., refined) based upon the evaluation.

In some embodiments, the actual data and/or the differences and/or similarities between the predictions and the actual events may also be used to update model logic and/or model parameters for determining the assessment period and/or the prediction period, the number of maintenance plans generated by the model, and/or the durations of those maintenance plans. By way of example, a model with a 2-year prediction period starting "today" that produces a preferred 2-year maintenance plan and an alternate 2-year maintenance plan may be updated to produce preferred and alternate maintenance plan sequences, for a 5-6 year prediction period starting "today" and ending 5 years from the last day of the following calendar or fiscal year (e.g., the resulting updated model may produce as output a recommended partial-year maintenance plan from now through the end of the current year (calendar or fiscal), and two 5-year maintenance plan sequences for the industrial asset, where the first (preferred) plan is recommended if the partial-year maintenance plan is performed, and the second (alternate) 5-year plan is recommended if the partial-year maintenance plan is not performed).

It will be appreciated that while reference is made to using data from a single industrial asset to update model logic, model parameters, the type(s) of model used, and/or the criteria for dividing industrial assets, data from a plurality of industrial assets may be used to determine updates. For example, a machine learning algorithm may pool data from a plurality of industrial assets to identify trends and/or patterns that may suggest whether it is better to update the criteria by which industrial assets are sub-divided, or to select a different model, or to update a model parameter(s) of the model previously selected for the subset, or to update model logic of the model previously selected for the subset, or to combine two or more models (e.g., to form a meta-model), or a combination of one or more of these considerations.

Figure 2:
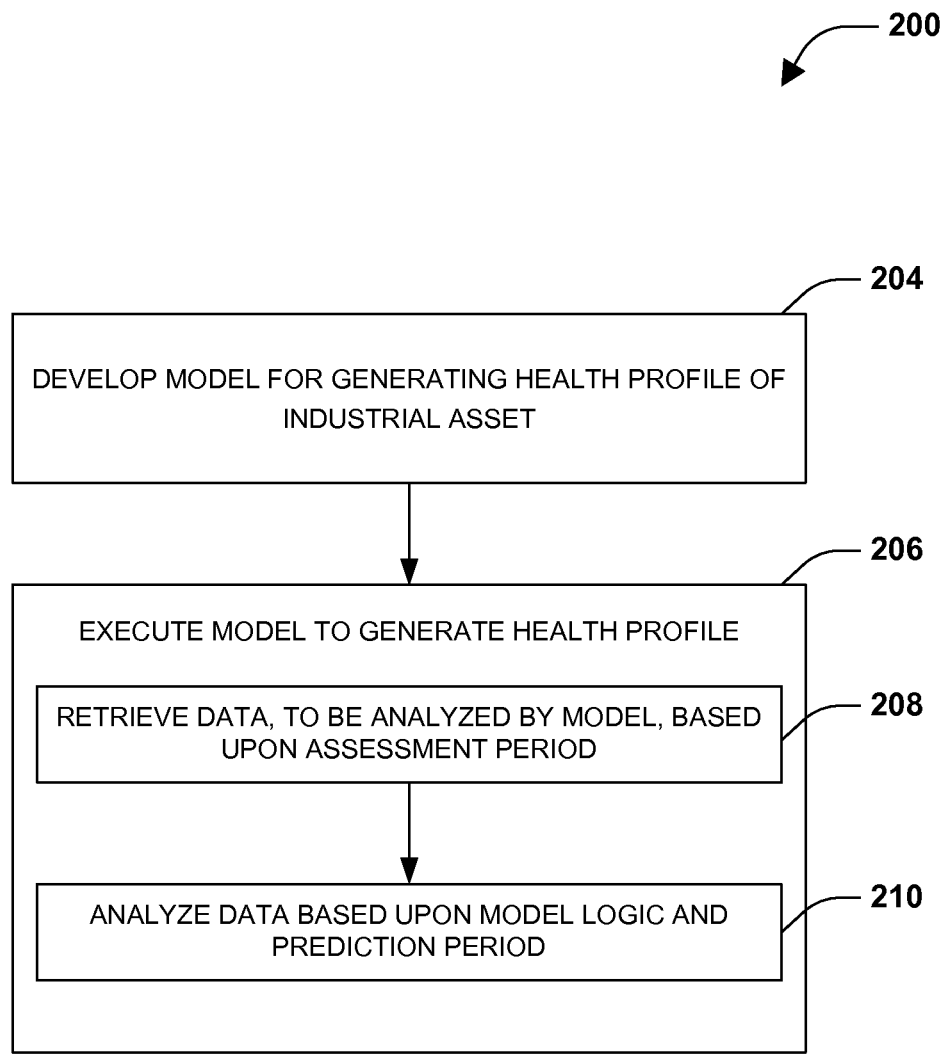
FIG. 2 is a flow diagram illustrating an example method for developing and applying a health profile of an industrial asset.

Referring to FIG. 2, an example method 200 for generating a health profile of an industrial asset (e.g., such as a first industrial asset of a first subset of industrial assets) is described. It may be appreciated that while reference is made herein to generating a health profile of a single asset, a similar method 200 may be utilized to generate health profiles for a plurality of industrial assets.

At 204 in the example method 200, a model is developed for generating the health profile of the industrial asset (e.g., 104 in FIG. 1). The model describes a process for analyzing data associated with the industrial asset to predict or forecast a health of the industrial asset, including one or more maintenance actions that are recommended to be performed on the industrial asset during a prediction period (e.g., to remedy the condition and/or lessen the likelihood or magnitude of an impact of the condition on an operating performance of the industrial asset and/or the system in which the industrial asset operates) and/or the impact of those maintenance actions on the health and/or performance of the industrial asset (e.g., is performing the maintenance action expected to increase longevity, increase capacity, etc.). For example, the model may predict that a repair to a circuit breaker may mitigate an imminent circuit breaker failure that could cause a current inrush to reach downstream equipment.

Figure 6:
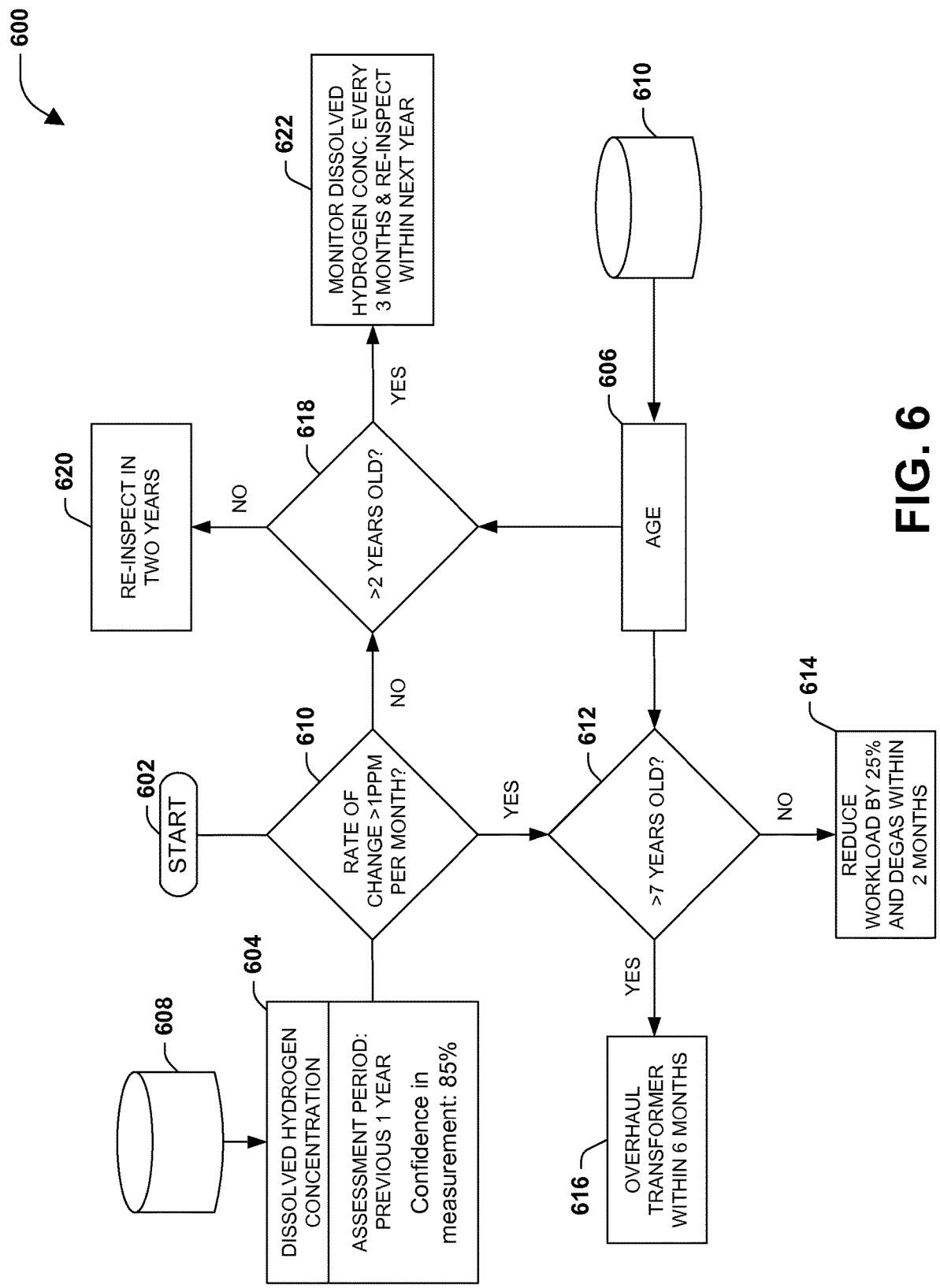
FIG. 6 illustrates an example model.

As further described with respect to FIG. 6, the model may include model parameters describing the data to be analyzed (e.g., type(s) of data to be considered by the model, timespan of data to be considered, a confidence in respective data types and/or sources, etc.) and/or model logic describing how the data is to be analyzed (e.g., how respective types of data are to be processed, etc.).

The model may be developed at 204 using historical data associated with the industrial asset and/or historical data associated with other industrial assets that satisfy specified criteria. By way of example, in some embodiments, a data mining algorithm may be configured to analyze historical data associated with the industrial asset to identify patterns in the historical data which relate conditions of the industrial asset to maintenance actions (e.g., an O-ring is commonly replaced within 8 months of oil levels dropping below two liters). As another example, the data mining algorithm may be configured to analyze historical data associated with a subset of industrial assets to which the industrial asset is a member (e.g., such as a subset of industrial assets that operate in a similar environment) to identify patterns in the historical data that are or are not predictive of conditions and/or maintenance actions that may or may not remedy such conditions.

In some embodiments, the model is developed at 204 by a subject matter expert with knowledge regarding the industrial asset and/or a class of industrial assets to which the industrial asset is a member. For example, the subject matter expert may have knowledge regarding operating properties of an industrial asset (e.g., dissolved gas concentrations, core temperature, ambient temperature, vibration measurements, wall thickness measurements, etc.) that may foreshadow a condition and/or may be probative when determining whether a particular maintenance action should be performed on the industrial asset. Accordingly, the subject matter expert may develop a model that uses data indicative of such operating properties to evaluate the probability that the condition may occur within a prediction period and/or to predict one or more maintenance actions that are recommended to be performed within the prediction period.

It may be appreciated that while specific reference is made herein to developing a model for generating the health profile of an industrial asset, the model may be developed at 204 for a class of industrial assets which includes the industrial asset. That is, the model may not be developed specifically for use with the industrial asset (e.g., but rather may generated as one, of several, different models that can be used to develop health profiles for a class of industrial assets to which the industrial asset is a member), and the model may subsequently be selected to generate a health profile for the industrial asset. By way of example, the model may be developed for a particular class of industrial assets and/or a subset of industrial assets (e.g., where, as previously described, a subset may relate to a group of industrial assets that operate in similar environments, are members of a same voltage class, share a common manufacturer, are similar in age, etc.). An example method for identifying subsets of industrial assets (e.g., also referred to herein as comparable assets) is described in further detail with respect to FIG. 9.

At 206 in the example method 200, the model is executed to generate the health profile of the industrial asset (e.g., as well as other industrial assets of interest that are members of a class or subset configured to be analyzed by the model) (e.g., 110 in FIG. 1). The model may be executed on demand and/or may be executed programmatically based upon a defined set of rules (e.g., execute the model to update the health profile of the industrial asset once every 3 months, execute the model to update the health profile when a particular event occurs with respect to the industrial asset, execute the model when it is desirable to update a report, etc.).

The health profile describes an expected health of the industrial asset during a prediction period(s) (e.g., including recommended maintenance actions during the prediction period(s)) and is generated based upon data associated with the industrial asset that has been collected/generated within an assessment period and/or multiple assessment periods (e.g., where a first assessment period may be applied to a first type of data and a second assessment period may be applied to a second type of data).

The assessment period(s) refers herein to a period of time during which data that forms the basis of the prediction is collected/generated. By way of example, data collected over the last year may be input into the model (e.g., where the last year is the assessment period). In some embodiments, the assessment period(s) is specified when the model is developed or updated (e.g., and may be a model parameter(s) and/or a compound parameter). In other embodiments, the assessment period(s) is specified (e.g., by a user) when the model is executed to generate a health profile for the industrial asset. By way of example, when a user desires to execute the model(s) for a particular industrial asset, a graphical interface may be presented that facilitates user entry of one or more parameters, such as desired assessment period and/or desired prediction period. The user may enter or select desired parameters, including a desired assessment period and/or a desired prediction period. By selecting an option to "run" the model(s), the model(s) may be updated for the user specified prediction period and/or assessment period and then executed, for example.

In some embodiments, the assessment period is relative in nature such that the assessment period is determined when the model is executed. By way of example, an assessment date and time may be specified relative to when the model is executed (e.g., 'today', or midnight of the last day of the preceding month), and the assessment period may be defined by the model as a period starting two months prior to the assessment date and ending on the assessment date (e.g., thus the dates included within the assessment period are a function of when the model is executed). In other embodiments, the assessment period is static in nature. For example, the assessment period may be defined as the first three months of the industrial asset's operational life (e.g., which does not change based upon when the model is executed).

As further described with respect to FIGS. 3-5, the assessment period may include past, present, and/or future times. By way of example, the assessment period may be a period that extends from one year ago today until six months into the future. It may be appreciated that where the assessment period extends into the future, real data (e.g., data indicative of real measurements, observations, etc.) may be unavailable. Accordingly, in some embodiments, the data that is provided to the model may include estimations and/or forecasts derived from real data and/or a confidence in those estimations and/or forecasts. For example, data indicative of expected dissolved gas concentrations for the next 6 months may be generated based upon extrapolations and/or interpolations of data indicative of dissolved gas concentrations readings for the past 6 months, past year, etc. In still other embodiments, model logic is configured to perform such forecasting and thus the data that is received by the model is merely real data (e.g., data indicative of real measurements, observations, etc.).

In some embodiments, the assessment period may be different for different types of data to be analyzed by the model. By way of example, it may be desirable for the model to analyze data indicative of an ambient air temperature that has been collected over at least a one year span, while it may be desirable for the model to analyze data indicative of dissolved gas concentrations within the industrial asset collected over merely a 6 month span. Accordingly, an assessment period for data indicative of ambient air temperature may be 1 year and an assessment period for data indicative of dissolved gas concentrations may be 6 months.

The prediction period(s) refers herein to a period of time during which a prediction is made. By way of example, it may be desirable to generate a health profile that includes a 6-month maintenance plan for the industrial asset (e.g., where the prediction period is a 6 month period starting today). As another example, it may be desirable to generate a health profile that includes a sequence of a partial-year maintenance plan plus five 1-year maintenance plans for the industrial asset (e.g., where the prediction period is a 5-6 year period starting today and ending 5 years from the last day of the following calendar or fiscal year). As still another example, it may be desirable to generate a health profile that includes a maintenance plan describing maintenance actions recommended to be performed 1-2 years from now (e.g., where the prediction period starts 1 year from today and ends 2 years from today).

The prediction period(s) may be included as a model parameter or may be determined when the model is executed. By way of example, in some embodiments, a data mining algorithm may determine, from the historical data, that the trends are merely valid for approximately a year (e.g., and thus the confidence in a prediction may be substantially reduced when forecasting maintenance actions to be performed more than a year from today). Accordingly, a model parameter may be included within the model that provides that the prediction period(s) may extend no further than one year from today. As another example, a user may specify the prediction period(s) at the time the model is to be executed. As yet another example, it may be desirable to generate a health profile that includes a maintenance plan through the end of life of the industrial asset, where the latest possible end of life for the asset may be partially or fully characterized in advance (e.g. via model parameters) or may be determined by the model.

To execute the model and generate a health profile, data to be analyzed by the model is retrieved at 208 from one or more data stores.

In some embodiments, the data that is retrieved may be a function of the model parameters and/or the assessment period(s). By way of example, the model parameters may limit the volume of data retrieved to include merely one or more specific type(s) of data. Example types of data include, among other things, data indicative of dissolved gas concentrations, data indicative of internal temperatures, data indicative of loadings, data indicative of metal fatigue measurements, data indicative of ambient air temperatures, data indicative of humidity measurements, data indicative of production output, data indicative of maintenance actions performed with respect to the industrial asset during the assessment period, etc. As another example, the assessment period(s) may limit the volume of data retrieved to include data collected/generated during merely a specified period of time.

In other embodiments, the data that is retrieved at 208 may include all or substantially all of the data associated with the industrial asset for which the health profile is being generated.

Executing the model also comprises analyzing the data based upon model logic and the prediction period at 210. The model logic describes a process by which the retrieved data is to be evaluated. For example, the model logic may describe how to compare different types of data, may describe trends to identify in the data, may describe the meaning of a trend, etc.

In some embodiments, the model logic may also describe a process by which a confidence is assigned to the data, a process by which the data is evaluated to generate a forecast (e.g., probability), and/or a process by which a confidence may be computed (e.g., where a higher confidence may be assigned to a first forecast relative to the confidence assigned to a second forecast based upon the quantity and/or quality of data used to generate the first forecast versus the second forecast). In some embodiments, such confidences may be used to weight the data when performing an analysis on the data and/or to weight a forecast, for example.

The example method 200 ends when a health profile of the industrial asset is generated indicative of an expected health of the industrial asset during the prediction period(s). As further described with respect to FIG. 7, such a health profile may include, among other things, a current health of the industrial asset and at least one maintenance plan (e.g., including one or more recommended maintenance actions and/or an expected health of the industrial asset during the prediction period(s) and/or at the end of the prediction period(s) if the maintenance plan is followed, and/or an expected health of the industrial asset during the prediction period(s) and/or at the end of the prediction period if the maintenance plan (e.g., or one or more actions listed therein) is not followed). It may be appreciated that the example method 200 may be executed more than once on a given industrial asset (e.g., other models, sets of model parameters, assessment periods, and/or prediction periods may be used in various combinations to analyze the same asset, and thus more than one health profile may be generated for an asset).

To further illustrate an assessment period and a prediction period, example graphs 300, 400, and 500 are provided. The graphs 300, 400 and 500 describe the concentration of dissolved hydrogen 302 in oil of a transformer based upon interpolations and/or extrapolations of actual measurements (e.g., by a sensor associated with the transformer and/or field testing of the transformer), which a model may be configured to analyze to forecast a health of the transformer during a prediction period and/or develop a maintenance plan(s) describing one or more maintenance actions during the prediction period. It may be appreciated that dissolved hydrogen concentration is merely one of many data types a model may consider when developing a health profile and thus dissolved hydrogen concentration is merely used as an example.

The y-axis 304 represents parts-per-million (ppm) and the x-axis 306 represents time. The assessment period 308 describes a time window of data samplings used to generate the health profile and the prediction period 310 describes a forecast window of interest. Thus, based upon the data acquired during the assessment period 308, one or more predictions or forecasts can be made about a state or health of the industrial asset during the prediction period 310 and/or about maintenance recommendations to be performed during the prediction period. Further, a confidence may be computed based upon the quality and/or quantity of data available during the assessment period 308. By way of example, the confidence in a forecast may be less if merely four dissolved hydrogen measurements were taken during the assessment period 308, relative to the confidence if one hundred measurements were taken during the assessment period 308.

The assessment period 308 and/or the prediction period 310 may be user-defined (e.g., by a subject-matter expert at the time the model is developed and/or by a user executing the model to generate a health profile) and/or may be programmatically-defined (e.g., such as via a learning algorithm that determines the assessment period 308 and/or the prediction period 310 based upon patterns identified in historical data and/or goals of an entity executing the model, for example). In FIG. 3, the assessment period 308 is defined to be a 6-month span that ends three months from the present date. Thus, the assessment period 308 includes merely data indicative of actual dissolved hydrogen readings and/or interpolations therefrom during the 6-month span. In other embodiments, such as illustrated in FIGS. 4 and 5, the assessment period 308 includes periods for time for which no actual data has yet been collected, such as the present day and/or 1.5-month span into the future. Thus, in such embodiments, the assessment period 308 may include forecasts of dissolved hydrogen readings derived by extrapolating actual dissolved hydrogen readings, for example. The prediction period 310 typically temporally post-dates the assessment period 308 (e.g., but does not necessarily post-date the assessment period 308 as there may be some overlap between the assessment period and the prediction period) and may or may not include a period of time over which dissolved hydrogen concentrations are forecasted. For example, in FIGS. 3 and 5, the prediction period includes a period of time over which dissolved hydrogen concentrations can be forecasted (e.g., with a specified degree of confidence in the extrapolation) whereas the prediction period 310 represented in FIG. 4 includes a period of time over which dissolved hydrogen concentrations cannot be forecasted (e.g., with the specified degree of confidence).

FIG. 6 illustrates an example model 600 which includes model logic (e.g., describing a process by which data is evaluated/analyzed) and model parameters (e.g., describing the types of data to be analyzed and the time period of data to be analyzed). In this example, the model 600 is configured to analyze dissolved hydrogen concentrations to determine whether insulation within a transformer is likely to need repaired within a prediction period (e.g., which for purposed of this example may be two years) and/or to identify recommended maintenance actions to repaired the degraded insulation. It may be appreciated that this model is merely as an example and that, in practice, (many) other factors may be considered by a model before predicting whether insulation should be repaired within the prediction period. Moreover, the need to repair the insulation may be defined as an absolute expression or relative expression (e.g., this transformer is more likely to need its insulation repaired than other similarly aged transformers of a same subset), may be discrete, and/or may be represented by a profile or curve.

To generate the example model 600, a subject matter expert and/or a data mining algorithm may review historical data associated with the industrial asset and/or other industrial assets (e.g., industrial assets of a class to which the industrial asset belongs, industrial assets operating under similar conditions, etc.) to identify patterns which typically indicate that insulation may be degrading and/or in need of repair and/or to identify patterns of maintenance actions which may effectively repair degraded insulation conditions. By way of example, a subject matter expert may initially review maintenance reports to identify instances where a maintenance technician has noted that he/she repaired insulation and/or may review inspection reports to identify instances where a field-inspector noted the insulation had degraded to an unhealthy level. The subject matter expert may then review historical data acquired in the days, months, etc. leading up to such instances to identify patterns or trends that may indicate that insulation is degrading to an unhealthy level and/or to the point where it needs to be repaired. For example, the subject matter expert may discover that the dissolved hydrogen concentration in oil increases at the rate of more than 1 ppm/month in the year leading up to such instances. The subject matter expert may further determine that degassing a transformer can be an effective technique for repairing the degraded insulation condition under some circumstances, whereas in other circumstances degassing is typically not cost-effective and a major overhaul of the transformer by the manufacturer is needed. The subject matter expert may further determine that if the insulation appears to be unlikely to need repair during the prediction period, a maintenance action such as offline dissolved gas analysis may be safely deferred for an additional year for older transformers and for an additional 2 years for newer transformers. Based upon these discoveries, the subject matter expert may create a model 600 that evaluates the rate of change for dissolved hydrogen to predict whether an insulation repair action should be performed within the prediction period, characterizes the confidence profile for this prediction, determines which repair technique is recommended based on the specific circumstances, and/or if no repair is determined to be needed, specifies when the next scheduled offline dissolved gas analysis should be performed.

Accordingly, in the example model 600, the subject matter expert may create a first set of model parameters 604 for data indicative of dissolved hydrogen concentrations and a second set of model parameters 606 for data indicative of age. The first set of model parameters 604 may include a reference to a first data store 608 from which data indicative of the dissolved hydrogen concentrations can be retrieved and an assessment period for the data indicative of the dissolved hydrogen concentrations. For example, in the illustrated embodiment, the first set of model parameters 604 specifies that the past 1 year of data is to be retrieved when the model 600 is executed or started at 602. The first set of model parameters 604 may also describe a confidence in the quality of the data. For example, the subject matter expert may be aware that a sensor embedded within the industrial asset is configured to measure dissolved gas concentrations, including dissolved hydrogen concentrations, with a precision of +/−1.3 ppm, which may translate into a confidence of approximately 85%, for example. In other embodiments, such a confidence may be determined based upon manufacturing specifications of the sensor, which may be stored in an enterprise data system, for example. The subject matter expert may also create additional model parameters other variables of interest, such as duration of usage, maintenance history, manufacturer, and voltage class of the transformer, and/or for the probability distribution function for the expected degradation of insulation over time for transformers of that maintenance history, manufacturer, duration of usage, and/or voltage class, for example.

When the example model 600 is executed or started at 602, the data referenced by the first set of model parameters 604 and/or the second set of model parameters 606 may be retrieved from the first data store 608 and/or the second data store 610 (e.g., referenced by the second set of model parameters 606) and analyzed according to model logic of the example model 600. By way of example, at 610 the model logic may provide for determining whether the dissolve hydrogen concentration is likely to increase at a rate exceeding 1 ppm/month during the prediction period (e.g., the next two years) based upon trends in the data generated over the assessment period (e.g., which is defined by a model parameter as the previous 1 year).

If a decision is made at 610 that the dissolved hydrogen concentration is likely to increase at a rate greater than 1 ppm/month during at least a portion of the prediction period, the age of the transformer may be evaluated at 612 to determine a recommended maintenance plan. By way of example, if the transformer is less than 7 years old, the model 600 may generate a health profile comprising a maintenance plan that includes reducing that workload of the transformer by 25% immediately and degassing the transformer within the next 2 months as indicated by 614. If the transformer is at least 7 years old, the model may generate a health profile comprising a maintenance plan that includes overhauling the transformer within the next 6 months as indicated by 616.

If a decision is made at 610 that the dissolved hydrogen concentration is not likely to increase at a rate greater than 1 ppm/month during at least a portion of the prediction period, the example model 600 may consider the age of the transformer at 618 to determine a recommended maintenance plan for the transformer. By way of example, if the transformer is less than 2 years old and not likely to experience a rate increase in dissolved hydrogen of more than 1 ppm/month during the prediction period, the example model 600 may generate a health profile comprising a maintenance plan that includes re-inspecting the transformer in two years as indicated by 620. If the transformer is at least 2 years old, the model may generate a health profile comprising a maintenance plan that includes monitoring the dissolved hydrogen concentration every 3 months and re-inspecting the transformer within the next year as indicated by 622.

Figure 7:
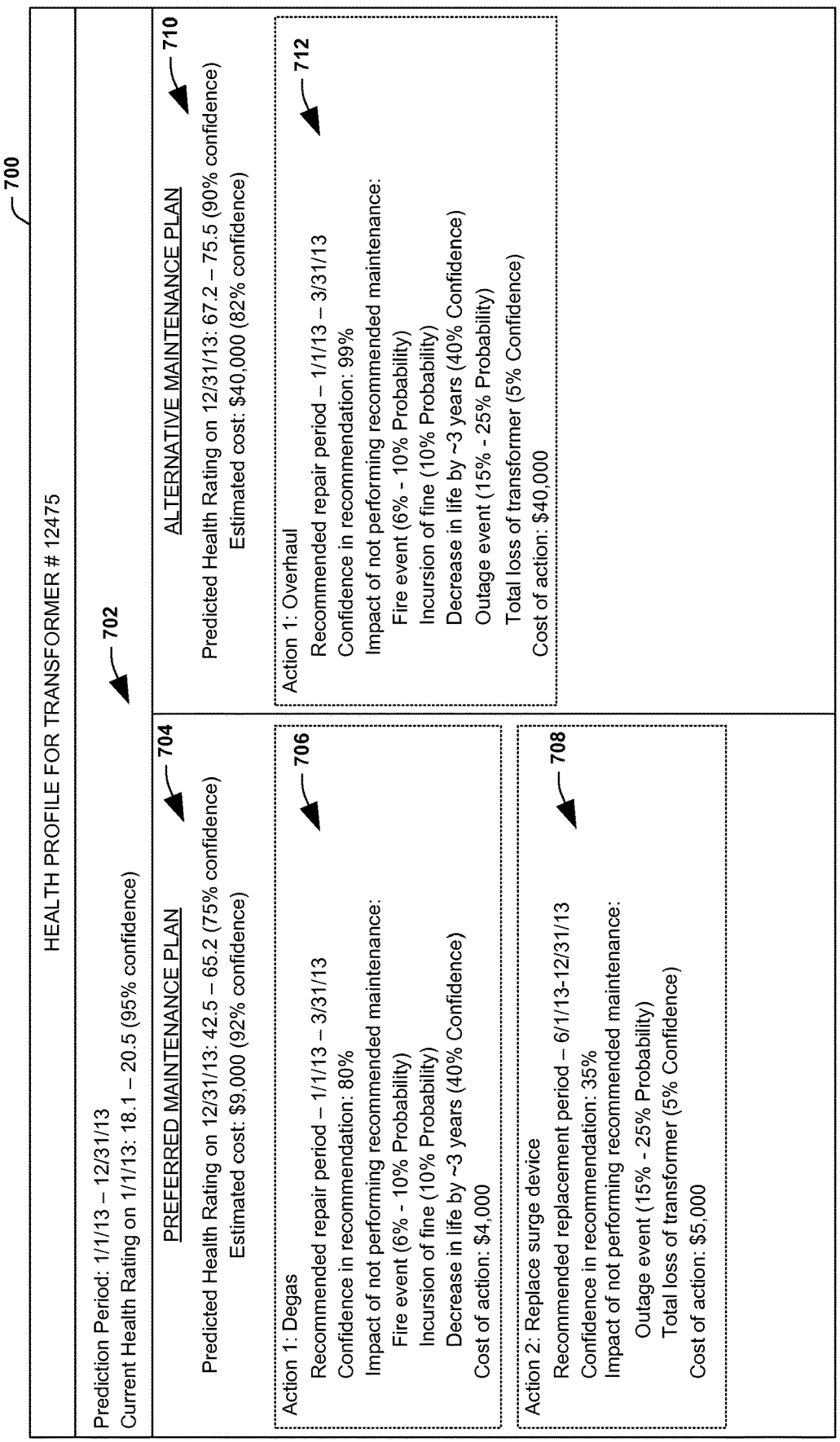
FIG. 7 illustrates an example health profile.

As will be further described with respect to FIG. 7, the health profile may also describe a confidence in the prediction (e.g., indicative of how confident the example model 600 is in the prediction that insulation will need to be repaired within the prediction period based upon a confidence in the data utilized to make the prediction and/or indicative of how likely it is that the recommended maintenance action will address the condition and/or impact of the condition) and/or information on how the health of the transformer may change based upon whether the insulation is repaired within the prediction period. By way of example, the health profile may include a notation that the life of the transformer is expected to decrease by 3 years if the transformer is not degased within the next 2 months. In some embodiments, such a decrease is also associated with a confidence describing how confident the model is with the prediction regarding the impact of performing or not performing the degassing, for example.

It may be appreciated that while the example model 600 is configured to make a binary decision, in some embodiments, model logic of the model 600 is configured to generate an action profile describing the certainty with which the model can determine that insulation will need to be repaired within the prediction period and/or can determine the expected impact of the recommended maintenance plan(s). By way of example, the prediction period may be defined as the next two years. Based upon the analysis of the dissolve hydrogen concentrations, there may be a high confidence associated with a prediction that within the next three months, the degraded insulation will not need to be repaired (e.g., and/or failure to repair the degraded insulation within the next three months will have minimal impact on operations and/or on the life of the transformer). Further, there may be a lower or higher confidence associated with a prediction that within 1-2 years from now, the degraded insulation will need to be repaired (e.g., and/or failure to repair the degraded insulation within the next 1-2 years will have a substantially impact on operations and/or on the life of the transformer).

FIG. 7 illustrates an example health profile 700 of a transformer, which may be generated using one or more models. By way of example, the model 600 of FIG. 6 may be used to determine whether a first maintenance action (e.g., degassing) should be performed within the prediction period and a second model may be used to determine whether a second maintenance action (e.g., replace surge device) should be performed within the prediction period. In other embodiments, a single model may be developed that can be used to whether it is desirable to perform a plurality of maintenance actions, including degassing, replacing a surge device, and/or overhauling the transforming, during the prediction period.

The health profile 700 comprises a prediction period field 702 describing the period of time during which the health profile 400 is applicable and a current health rating of the industrial asset based upon the current performance of the industrial asset (e.g., as determined based upon recently acquired sensor data, field test data, etc.). By way of example, in the illustrated embodiment, the prediction period begins today, on Jan. 1, 2013, and ends on Dec. 31, 2013.

The health profile 700 also comprises one or more maintenance plans for the transformer describing maintenance actions to be performed with respect to the transformer during the prediction period. By way of example, the health profile 700 comprises a preferred maintenance plan 704 and an alternate maintenance plan 710, respectively describing one or more maintenance actions that are recommended to be performed (e.g., and/or that will be required to be performed) on the industrial asset during the prediction period. In some embodiments, respective maintenance plans 704, 710 may describe an estimated cost associated with the maintenance plan (e.g., which may include the cost of parts, labor, downtime, etc.) and/or an expected health (e.g., health range) of the industrial asset during and/or at the end of the prediction period if the maintenance plan is followed. In some embodiment, a confidence or confidence profile associated with one or more predictions associated with the maintenance plans 704, 710 may also be included.

Respective maintenance plans comprises one or more recommended maintenance actions to be performed within the prediction period. For example, the preferred maintenance plan 704 may comprise a first maintenance action field 706 which recommends repairing the insulation within the transformer by degassing the transformer and a second maintenance action field 708 which recommends replacing a surge device associated with the transformer. As another example, the alternative maintenance plan 710 comprises a third maintenance action field 712 which recommends overhauling the transforming (e.g., to correct the degraded insulation condition and/or the failing surge device). In some embodiments, one or more of the maintenance action fields 706, 708, 710 further include a recommended timeframe for performing the maintenance action(s), an expected impact of performing and/or not performing the maintenance action, and/or an expected cost of performing the maintenance action(s). For example, in the illustrated embodiment, the first maintenance action field 706 includes a recommendation that the transformer be degassed between Jan. 1, 2013 and Mar. 31, 2013 at an estimated cost of $4,000. Moreover, the first maintenance action field 706 notes that the transformer is at a 6%-10% risk of a fire event within the prediction period if the first maintenance action is not performed within the recommended timeframe.

In some embodiments, at least some of the predictions included within at least one of the first maintenance action field 706, the second maintenance action field 708, and/or the third maintenance action field 712 are associated with a confidence profile describing a confidence in the prediction. By way of example, there is an 80% confidence in the prediction that transformer will need to be degassed within the prediction period.

A model or models used to generate the health profile 700 and/or other health profiles may be periodically and/or intermittently updated (e.g., programmatically and/or by subject matter experts) based upon data acquired during the prediction period. In this way, the model may be updated to reflect recent discoveries or patterns that were not evident in an initial set of data used to construct the model or models, for example. Moreover, updating the model may facilitate addressing operational and/or physical changes to an industrial asset, a subset of industrial assets operating within similar environments, and/or a class of industrial assets to which the model pertains. By way of example, a model may be developed based upon historical data accumulated while a set of transformers comprised oil having a first composition. Since the model has been developed, the oil in a subset of the transformers may have been replaced with oil having a second composition. Accordingly, it may be desirable to update the model (e.g., including updating model parameters and/or model logic) in view of the change in oil composition.

Updating the model may also facilitate addressing incorrect and/or changed assumptions. For example, during initial model development, it may have been determined that the rate at which dissolved hydrogen increases can be used to assess whether degassing is likely to be required during the prediction period. However, after additional data, such as additional maintenance reports, is acquired, it may be determined that maintenance technicians that are dispatched to transformers that experience an increase in dissolved hydrogen of at least 1 ppm/month often do not degas the transformer and/or indicate insulation degradation. Thus, the rate at which the dissolved hydrogen concentration increases may not be a good predictor of degraded insulation (e.g., and/or the need to degas the transformer) and the data may be reanalyzed to identify other types of data that are better predictors.

Figure 8:
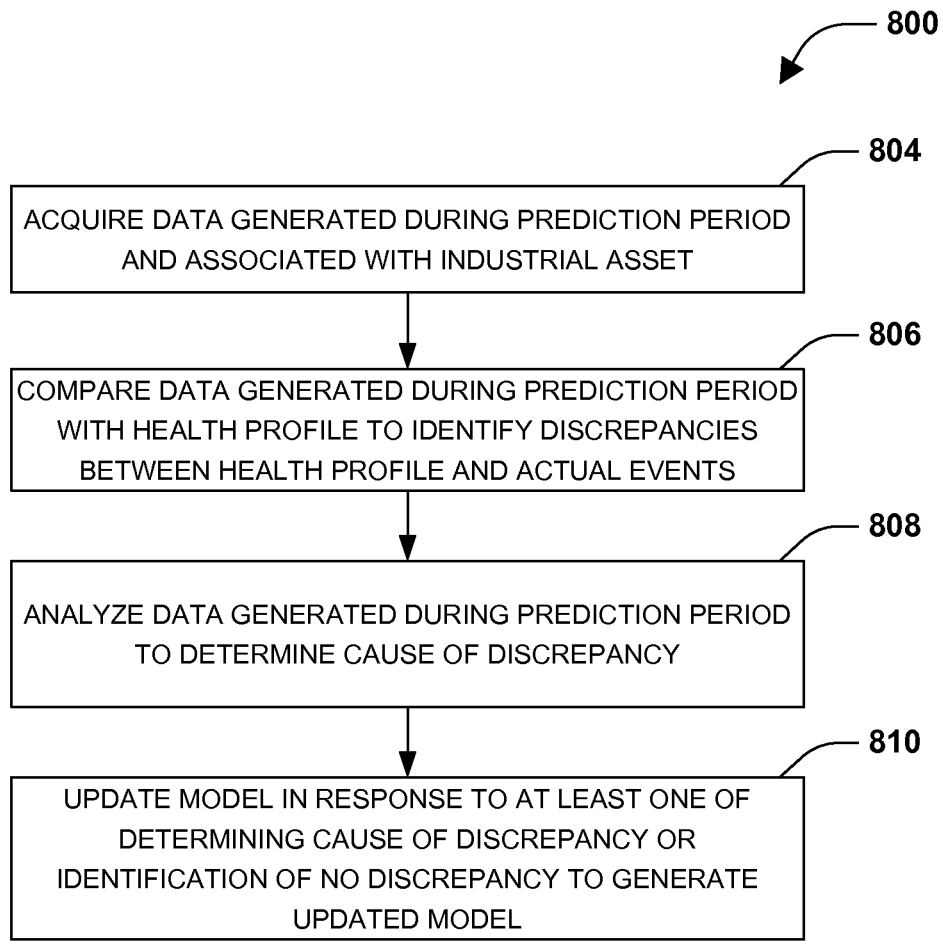
FIG. 8 illustrates an example method for updating a model configured to develop a health profile of an industrial asset.

FIG. 8 illustrates a flow diagram of an example method 800 for updating a model which may recommend one or more maintenance actions to be performed with respect to an industrial asset during a prediction period. The method for updating the model may be executed on demand and/or may be executed programmatically based upon a defined set of rules (e.g., update the model once every 3 months, update the model when a particular event occurs with respect to the set of industrial assets, etc.).

At 804 in the example method 800, data generated during the prediction period and associated with the industrial asset is acquired. The data that is acquired may include data yielded from sensors embedded within the industrial asset, data yielded from field test and/or inspections, data yielded from maintenance reports, data yielded from enterprise systems (e.g., which indicate the load placed on the industrial asset and other operating conditions), and/or data yielded from external sources (e.g., such as temperature probes, humidity probes, etc.), for example. In some embodiments, the data that is acquired at 804 may also include data that was not generated during the prediction period but was generated since the model was initially developed and/or last updated. In some embodiments, data may be acquired that reflects the previous usage of the model (e.g., the specified assessment periods and prediction periods, the amounts, types, and/or sources of data provided when the model was executed, etc.).

While reference is made herein to acquiring data associated with a single industrial asset, data associated with a plurality of industrial assets may be acquired at 804. By way of example, data from a subset of industrial assets that were defined at 106 and/or 112 in the example method of FIG. 1 may be acquired at 804. In this way, a larger pool of data may be acquired (e.g., as opposed to the pool of data acquired if merely data associated with a single industrial asset were acquired) and used to identify trends, patterns, etc. that can be useful to consider when determining whether and/or how to update the model.

At 806 in the example method 800, the data generated during the prediction period and/or other acquired data is compared to a health profile of the industrial asset to identify discrepancies, if any, and/or similarities, if any, between the information in the health profile and actual events that occurred with respect to the industrial asset during the prediction period. By way of example, the data acquired at 804 may be analyzed to determine whether or when a recommended maintenance action(s) was performed during the prediction period, the impact of performing or not performing the maintenance action(s) (e.g., did the health of the industrial asset degrade as expected if the maintenance action was not performed, did the industrial asset's operational performance change as expected when the maintenance action was performed, etc.). As another example, maintenance reports generated during the prediction period may be analyzed to determine whether a maintenance technician was dispatched to the industrial asset during the prediction period and performed a maintenance action not included in the maintenance plan.

If one or more discrepancies between the predicted health profile and recommended maintenance actions and the actual health profile and/or actual maintenance actions are identified, the data generated during the prediction period (e.g., and/or other data generated or acquired since the model was initially developed or last updated) is further analyzed at 808 to determine a cause(s) of the discrepancy (e.g., to determine what assumption, parameter, and/or calculation may have caused an incorrect prediction). Such a review may include whether preemptive maintenance was performed that impacted the prediction (e.g., rendered the inaccurate prediction obsolete), whether unexpected operational changes and/or environmental changes impacted the prediction, whether forecasts developed to make the prediction were inaccurate (e.g., if operational loading was expected to continue at a certain level or trend but did not do so), and/or whether one or more data types decreased or increased in validity as a predictor of a condition and/or as a predictor of a maintenance action or the impact of a maintenance action, for example. In some embodiments, such a review may occur even if there were no discrepancies. By way of example, model logic and/or model parameters may be updated at 810, even if there are no discrepancies identified, to alter how predictions or confidences are computed (e.g., to increase a confidence in future predictions).

By way of example, if the comparison at 806 determines that a different maintenance action was performed, data associated with the industrial asset may be reviewed to assess why a different maintenance action was performed. For example, if it can be determined that the maintenance technician simply neglected to replace the degraded insulation, there may be no reason to update the model based upon the maintenance technician's actions (e.g., because the model's recommended action(s) may have been more correct than the technician's actions). If it can be determined that the maintenance technician intentionally did not replace the degraded insulation (e.g., a note in the maintenance report indicates that the insulation was within an allowable tolerance) and/or if it can be determined that another maintenance action corrected a forecasted condition (e.g., and thus replacing the insulation was not necessary to correct the condition), historical data of one or more industrial assets may be analyzed to determine how to update the model to more accurately recommend maintenance actions, for example.

It may be appreciated that while the example method 800 describes comparing actual maintenance actions of a single transformer to recommended maintenance actions of the transformer, in some embodiments, such updates may be made based upon the activity of a set of industrial assets (e.g., such as a subset of industrial assets that were formed at 106 and/or 112 in the example method 100 of FIG. 1). For example, health profiles may be generated for a subset of industrial assets respectively, including a maintenance plan describing zero or more maintenance actions that are recommended to be performed during respective prediction periods. Actual data acquired from respective industrial assets during the prediction periods may then be compared to the health profiles to identify discrepancies and/or accuracies in respective forecasts. In this way, trends in the discrepancies and/or accuracies can be identified and/or other discoveries can be made and used to adjust a model parameter and/or model logic, for example.

The following paragraphs provide examples of how the data may be reviewed at 808 to determine a cause of discrepancies and/or to determine whether/how to update a model. It may be appreciated that such examples are not intended to limit the scope of the application, including the scope of the claims.

In some embodiments, the analysis at 808 comprises evaluating whether an event or circumstance occurred that rendered a prediction obsolete and/or that was unpredictable. By way of example, the health profile may include a recommendation to repair insulation within the next 1-2 years. If, upon a review of operational records, it appears that the loading on the transformer was substantially reduced before or during the prediction period (e.g., and/or before insulation degradation was expected to fully occur), the lack of a repair during the prediction period may be attributed to pre-emptive actions. Accordingly, the discrepancy between the prediction and what actually occurred may be due to preemptive actions and not due to an inaccuracy of the model, for example (e.g., and the model may not be updated). As another example, insulation may be required to be repaired sooner than predicted due to an unexpected (e.g., unpredictable) event (e.g., a weather event such as storm surge) and not due to an inaccuracy of the model. Thus, the discrepancy is due to an unexpected event and not due to a failure of the model.

In some embodiments, the analysis comprises comparing data generated during the prediction period to forecasts that provided a basis of the inaccurate prediction to determine if an inaccurate forecast caused the inaccurate prediction. By way of example, the maintenance action may have been recommended based at least in part upon an expected frequency and/or intensity of lightning storms during the prediction period. Based upon actual weather records for the prediction period, it may be determined that the frequency and/or intensity of lightning storms was much greater than expected. Accordingly, the inaccuracy of the maintenance action is a result of an inaccurate weather forecast. Accordingly, the model was not necessarily wrong, although a confidence interval or profile associated with the weather forecast may be adjusted. On the other hand, if the model used merely peak intensity forecasts and did not consider the frequency of lower intensity lightning strikes, the model logic may be updated to formulate the health prediction based upon the frequency of lower intensity lightning strikes.

In still some embodiments, the analysis comprises determining the health consequence of performing or not performing a recommended maintenance action during the prediction period. By way of example, the model may have recommended degassing the transformer and/or replacing the oil to address insulation degradation. However, records acquired during the prediction period may show that a high percentage of the time (e.g., for a group of similarly configured industrial assets), the technicians (e.g., some or all technicians) have a high frequency of breaking something (e.g. a seal) on the transformer in the course of performing this maintenance. As another example, the records acquired during the prediction period may show that replacement oil typically used is of poor quality and the transformer's insulation capability with fresh poor-quality oil is actually worse than it was with the old oil. Accordingly, the model may be updated to not recommend degassing the transformer and/or replacing the oil to address insulation degradation (e.g., unless the insulation degradation becomes even more severe) because the transformer actually remains healthier and/or performs better when not degassed and/or not re-oiled. As still another example, model parameters and/or model logic may be updated to consider additional considerations based upon these findings. By way of example, the model may be updated to consider available technicians to perform a repair. Accordingly, if technician A, who has a history of breaking a seal when performing the degassing, is likely to be dispatched to perform the maintenance, the model may recommend a different maintenance action than would be recommended if technician B, who does not have a similar history, is likely to be dispatched to perform the maintenance. In still another embodiment, the model may be updated to include, as a feature in the health profile, recommended technicians for certain maintenance actions and/or recommended products to be used when performing certain maintenance actions (e.g., do not use oil A in 20-40 kV transformers manufactured by manufacturer ABC).

As yet another example, the analysis may be used to adjust the timing of one or more maintenance actions that a model may recommend. By way of example, when the health profile of an industrial asset was generated by a model, a maintenance plan may have included a recommendation to perform an inspection on the industrial asset every three months during a prediction period. However, when actual data acquired during the prediction period (e.g., and associated with the industrial asset and/or other similarly configured industrial assets) was analyzed at 808, it may have been revealed that performing the maintenance action every three months did not improve the useful life of the industrial asset to the extent expected (e.g., the improvement was not substantial enough to justify the time and/or cost associated with the inspection). Accordingly, the model may be adjusted to alter (e.g., increase) the length of time between recommended inspections and/or to forego making such a recommendation when the model is executed to generate future health plans. As another example, the analysis may have revealed that if a maintenance action (e.g., degassing) was not performed by a prescribed time in the lifecycle of the industrial asset, performing the maintenance action later in the lifecycle may not be beneficial. Accordingly, the model may be updated to emphasize the importance of the maintenance action when generating a health profile for an industrial asset approaching the prescribed time and/or to deemphasize (e.g., not recommend) the maintenance action for industrial assets that have not had the maintenance action previously performed at the prescribed time in their lifecycle.

At 810 in the example method 800, the model used to generate the health profile of the industrial asset is updated to generate an updated model in response to determining a cause of a discrepancy and/or in response to identifying no discrepancy. The updating may include updating one or more model parameters (e.g., updating the types of data used to make predictions included in a health profile) and/or updating model logic (e.g., updating a process by which the data is analyzed to render the predictions included in the health profile). It may be appreciated that where no inaccuracies were identified in the health profile, in some embodiments, the model is not updated. In other embodiments, the model may be updated even when no inaccuracies were identified. By way of example, the determination that there were no inaccuracies may improve the confidence in one or more predictions. Accordingly, the model may be updated to reflect the improvement in confidence.

The example method 800 ends after the model has been updated and/or after it is determined that no update to the model is desired.

It is to be appreciated that while the example method 800 describes a technique for updating a model used to generate the health profile, in some embodiments the discoveries and/or findings at 808 may be applied to other models as well. By way of example, based upon the analysis at 808, it may be determined that model A should recommend overhauling transformers that are at least 5 years old and experiencing degraded insulation instead of degassing such transformers. Model B, which generates health profiles for a similar class of transformer as model A, may also be updated based upon this analysis. As another example, the results of the analysis at 808 may be used to update model B while not being used to update model A.

Figure 9:
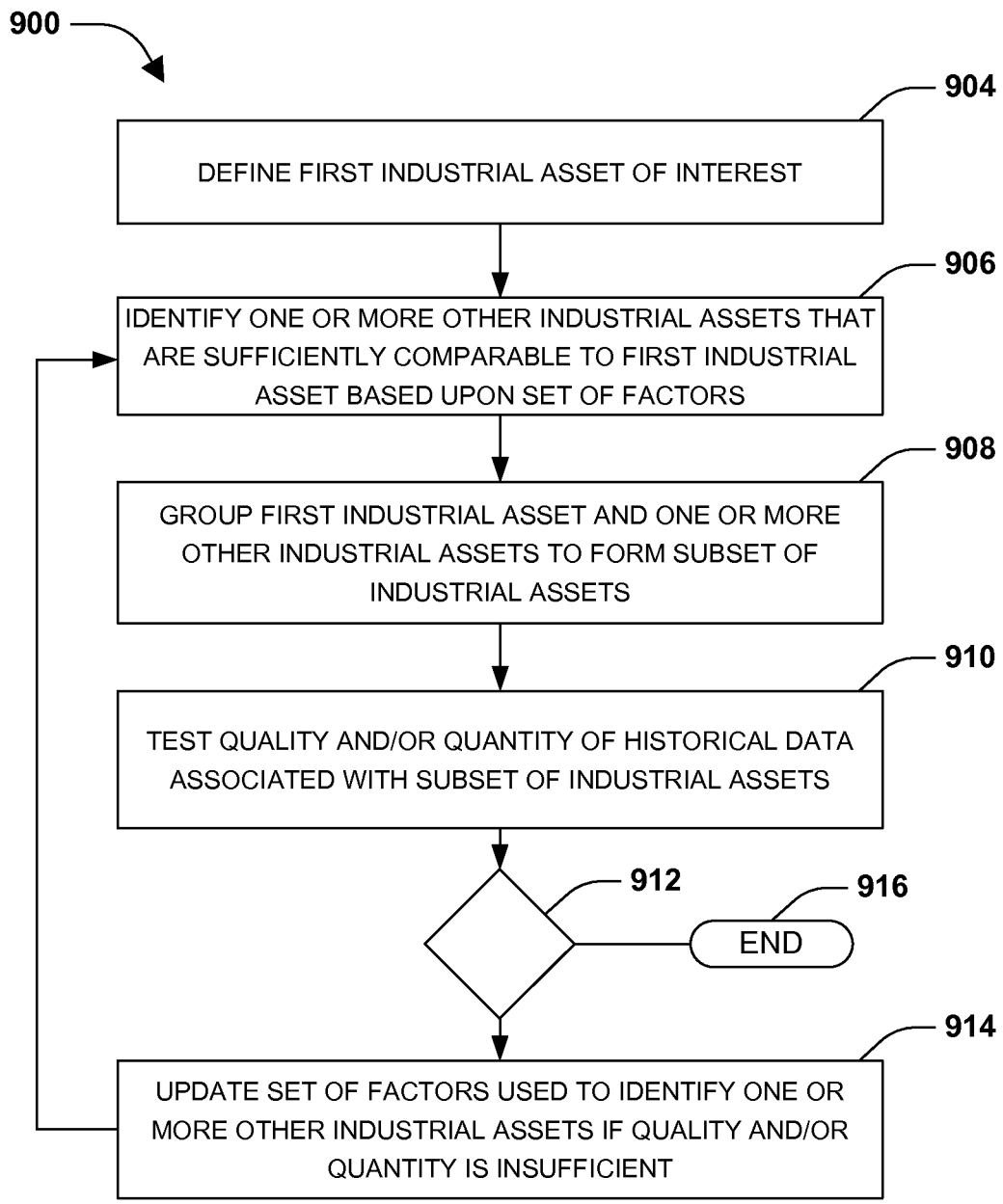
FIG. 9 is a flow diagram illustrating an example method for identifying comparable industrial assets.

As described with respect to FIG. 2, in some embodiments, the model may be generated and/or updated based upon available data from a set of similar industrial assets which define a subset of industrial assets (e.g., a set of comparable assets) (e.g., as described at 106 in FIG. 1). For example, historical data from a plurality of transformers operating under similar loading conditions in similar environments may be aggregated by a machine learning algorithm configured to generate the model based upon identified patterns in the historical data. FIG. 9 illustrates an example method 900 for identifying comparable assets to create a subset of industrial assets.

At 904 in the example method 900, a first industrial asset of interest is defined. The first industrial asset may be arbitrarily defined by a user, for example, desiring to develop a model which assesses the health of the first industrial asset.

At 906 in the example method 900, one or more other industrial assets are identified that are sufficiently comparable to the first industrial asset. As used herein, two industrial assets are sufficiently comparable when a degree of similarity, based upon a given set of one or more criteria, exceeds a similarity threshold. The set of criteria relate to operating conditions of the industrial assets and/or environmental conditions proximate the industrial assets, for example. By way of example, criteria that may be analyzed to assess a degree of comparability may include, among other things, manufacturer, age (e.g., since manufacturing, deploying, etc.), type (e.g., dry, wet, amorphous, etc.), voltage class (e.g., 50 kV class, 80 kV class, etc.), model, features (e.g., lightning arrester, operating features, etc.), ambient air temperature of environment surrounding industrial asset, humidity content proximate industrial asset, usage (e.g., operating time, workload, etc.), event history (e.g., # of degradation events and/or non-degradation events), maintenance history (e.g., whether recommended maintenance was performed), industrial domain within which the industrial asset operates (e.g., residential domain, various commercial domains, etc.), level of instrumentation (e.g., # and/or type of embedded sensors, etc.), subsystem configuration (e.g. protection scheme), and/or number of redundant assets (e.g., how many other assets are available that could provide redundancy for the industrial asset).

The criteria that are analyzed to assess the degree of comparability between a first industrial asset and other industrial assets may be specified by a user (e.g., a subject matter expert) and/or may be determined programmatically based upon historical data. For example, in some embodiments, an algorithm is configured to identify industrial assets that have tended to operate similarly based upon historical data and to identify features that those industrial assets have in common. Based upon the identified features, criteria can be developed to consider when searching for and/or identifying assets that are sufficiently comparable to the first industrial asset.

At 908 in the example method 900, the first industrial asset and the one or more other industrial assets that are sufficiently comparable to the first industrial asset are grouped to form a subset of industrial assets.

At 910 in the example method 900, the quality and/or quantity of historical data associated with the subset of industrial assets is tested to evaluate whether a model can be generated and/or updated using the historical data. More particularly, the quality and/or quantity of historical data are tested to determine whether patterns can be identified with a specified degree of confidence, where the patterns serve as the basis for generating/updating the model.

In some embodiments, the output of the testing is a numerical score or other grading feature that describes the strength of the data (e.g., in terms of quality and/or quantity). If the strength of the data is below a threshold, a decision may be made at 912 to update the set of criteria at 914. For example, if a numerical score of 0-50 (e.g., where 0 is worst and 100 is best) is associated with the data, the quality and/or quantity of the data set may be too weak for updating the model, and a decision may be made at 912 to update the set of criteria (e.g., broaden the criteria to increase the number of industrial assets within a subset). If the strength of the data is above the threshold, a decision may be made at 912 that the subset is a good subset, may end the method 1100 at 916, and may proceed with selecting a model, updating a model, etc. as described in FIG. 1.

In some embodiments, if the strength of the data is above a second threshold, a decision may be made at 912 to update the set of criteria at 914. For example, if a numerical score of 51-80 is associated with the data, a decision may be made at 912 to end the method 900 at 916 and/or proceed with selecting a model, updating a model, etc. If a numerical score greater than 80 is associated with the data, the strength of the data may be so strong that the subset could be further sub-divided to reduce the data set (e.g., and thus more narrowly focus the model). Thus, a decision may be made at 912 to update the set of criteria at 914 (e.g., by stratification, principal component analysis, etc.), to increase the number of criteria and/or change a scope of the criteria to decrease the number of industrial assets within the subset (e.g., by adding additional criteria, such as manufacturer, to reduce the pool of industrial assets within the subset).

At 914, the set of criteria is updated and/or the similarity threshold is updated if the quality and/or quantity of historical data is insufficient to generate and/or update the model. For example, the number of criteria and/or scope of criteria that are considered may be reduced (e.g., lessening the number of filters) to increase the number of industrial assets that are sufficiently comparable to the first industrial asset. As another example, the similarity threshold may be reduced to increase the number of industrial assets that are sufficiently comparable to the first industrial asset. By way of example, the permissible manufacturing date range may be increased from a 5-year window to a 10-year window to increase the number of industrial assets that may be sufficiently comparable to the first industrial asset.

The process of identifying, grouping, and/or testing is then iteratively repeated (e.g. until the quality and/or quantity of historical data is sufficient to generate and/or update a model).

The method 900 ends at 916 when the results of the test meets predetermined criteria and/or when other stopping criteria have been met.

Figure 10:
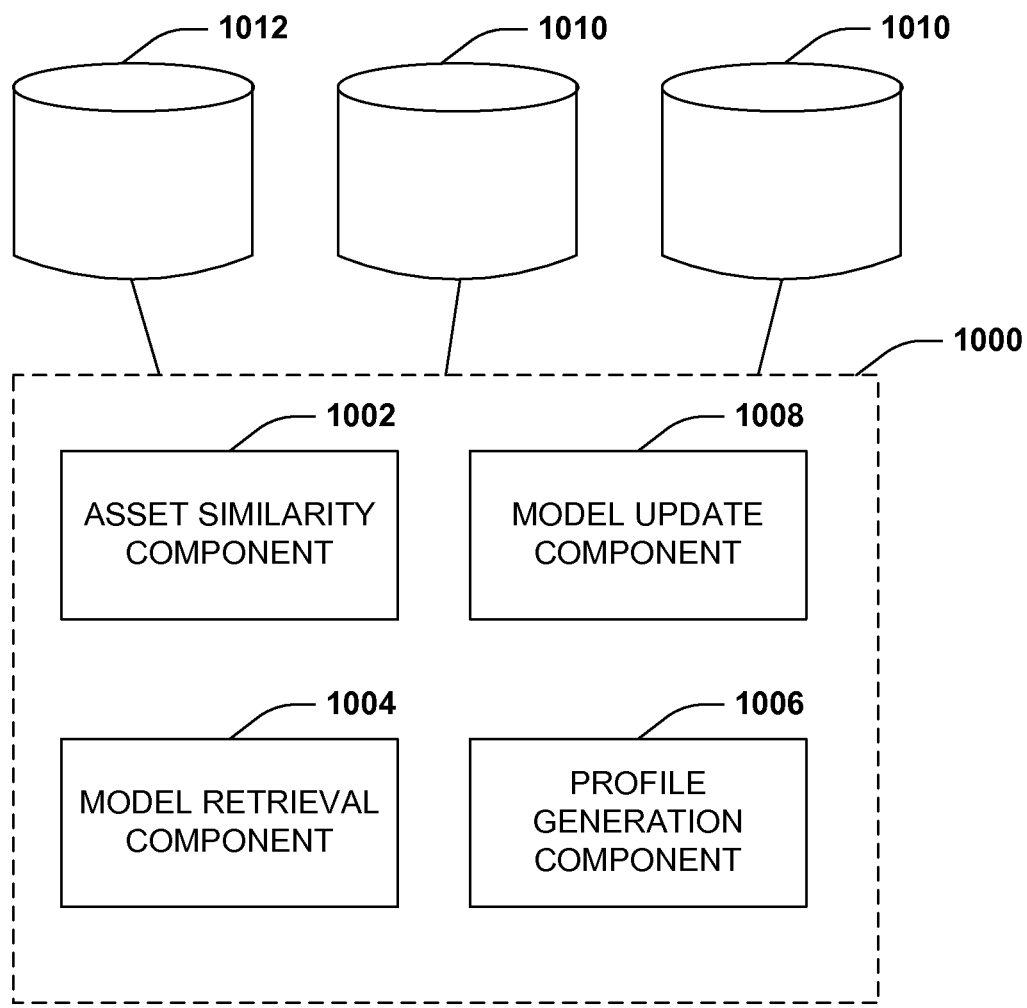
FIG. 10 is a component block diagram illustrating an example system for updating a health model configured to develop a health profile of an industrial asset.

Referring to FIG. 10, an example system 1000 for generating a health profile of an industrial asset that includes a maintenance plan(s) including one or more maintenance actions to be performed during a prediction period is described. The example system 1000 may be operably coupled to one or more data stores 1010 from which data indicative of one or more industrial assets may be retrieved. The data may include nameplate data, operational data, environmental data, performance data, maintenance data, information about how often and/or over what period the health of the industrial asset was evaluated during the prediction period, operating conditions during the prediction period, and/or other information that may be used to assess the reliability and/or accuracy of the first health profile and/or the second health profile.

The example system 1000 is configured to update a model(s) that has been developed using historical data from a set of industrial assets and comprises an asset similarity component 1002 (e.g., configured to perform divisions described in 106, 112, and/or 118 in the example method 100 of FIG. 1), a model retrieval component 1004 (e.g., configured to select a model at 108, 112, and/or 118 in the example method 100 of FIG. 1 and to retrieve the selected model), a profile generation component 1006 (e.g., configured to generate health profiles at 110 and/or 114 in FIG. 1), and a model update component 1008 (e.g., configured to evaluate health profiles at 116 and/or update a model at 118).

The asset similarity component 1002 is configured to identify industrial assets that have a sufficient degree of similarity to divide the industrial assets into subsets, where similarity is evaluated based upon a set of one or more criteria, as described earlier with respect to FIG. 9. For example, the criteria may include performance factors, physical factors (e.g., age), and/or environmental factors. By way of example, in some embodiments, it may be desirable to develop a model based upon data yielded from a set of transformers that were manufactured within a specified two-year interval and that have a voltage capacity of 45 kV to 55 kV. Accordingly, nameplate data may be retrieved from a data source 1010 to identify transformers that match the specified criteria. As another example, it may be desirable to identify a set of transformers that were manufactured within a specified 10-year interval and operate under similar environmental conditions. Accordingly, nameplate data may be retrieved from a first data source 1010 and ambient air temperature data may be retrieved from a second data source 1010 to identify transformers that were manufactured during the specified time interval and experience similar ranges or patterns of ambient air temperature. Other types of conditions that may be relevant when determining whether a set of industrial assets is sufficient similar include average loading, average output, humidity fluctuations, air content (e.g., is there a high level of particulate matter in the air or a high concentration of salt in the air), and/or maintenance history (e.g., industrial assets that have had recommended maintenance may perform differently than industrial assets that have not had recommended maintenance), for example.

The model retrieval component 1004 is configured to select a model(s) to be used to generate a health profile for an industrial asset and/or to retrieve, when the health profile is to be generated, the selected model(s) from a model data store 1012 where models that have been developed for a particular class of industrial asset (e.g., transformer, circuit breaker, etc.) are stored. It may be appreciated that as described with respect to FIG. 1, in some embodiments, the model retrieval component 1004 is further configured to associate one or more subsets with a particular model(s) and the selection corresponds to a selection of the model(s) associated with the subset to which the industrial asset is a member. For example, a first model may be associated with a first subset of industrial assets and a second model may be associated with a second subset of industrial assets. Accordingly, when it is desirable to generate a health profile for an industrial asset that is a member of the first subset, the model retrieval component 1004 may retrieve the first model. When it is desirable to generate a health profile for an industrial asset that is a member of the second subset, the model retrieval component 1004 may retrieve the second model. As further described in FIG. 1, the associations between subsets and models may change over time based upon the ability of the model to generate an output having a desired confidence (e.g., or confidence range) and/or based upon changes in how industrial assets are divided/grouped into subsets.

The profile generation component 1006 is configured to generate a health profile of an industrial asset using the model retrieved by the model retrieval component 1004. More particularly, the profile generation component 1006 is configured to retrieve data indicative of the industrial asset from one or more data stores 1010 referenced by the model and generated during an assessment period. The profile generation component 1006 is also configured to apply the retrieved data to the model, which then analyzes the data to generate the health profile.

The model update component 1008 is configured to update models and to store the updated models in one or more model data stores, such as the model data store 1012 (e.g., for later retrieval by the model retrieval component 1004 when it is desirable to generate health profile using the updated model). In some embodiments, the model update component 1008 is configured to update one or more models based upon a comparison of the health profile generated by the profile generation component with data generated during the prediction period and indicative of the industrial asset. That is, stated differently, the model update component 1008 is configured to update the model based upon a comparison between recommended events and actual events. For example, the model update component 1008 may update model logic and/or a model parameter based upon discrepancies between the health profile and actual events, and/or based upon new patterns which can be identified in view of the data generated during the prediction period (e.g., which could not be identified merely based upon the historical data).

Figure 11:
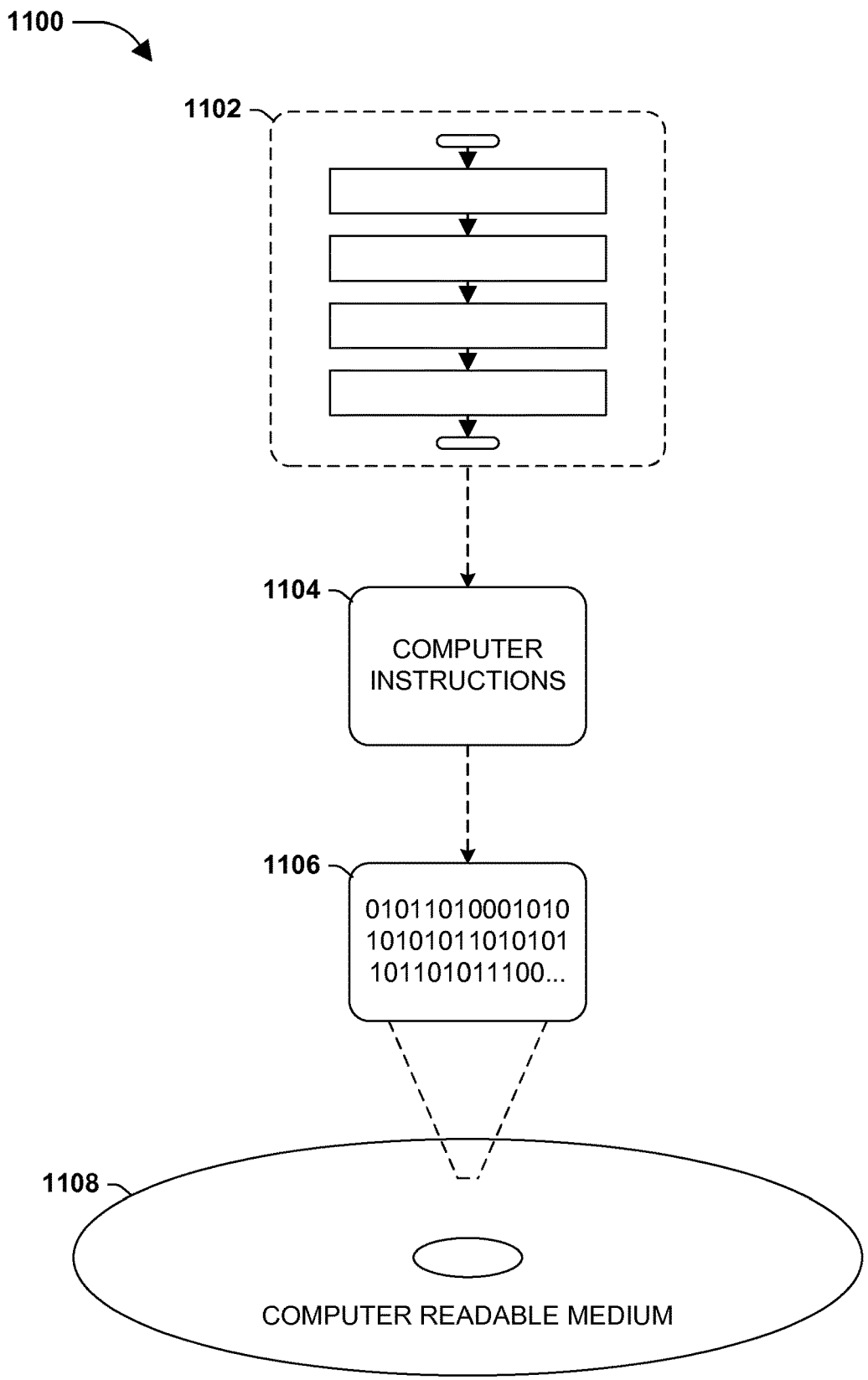
FIG. 11 is an illustration of an exemplary computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An example computer-readable medium that may be devised in these ways is illustrated in FIG. 11, wherein the implementation 1100 comprises a computer-readable medium 1108 (e.g., a flash drive, CD-R, DVD-R, application-specific integrated circuit (ASIC), field-programmable gate array (FPGA), a platter of a hard disk drive, etc.), on which is encoded computer-readable data 1106. This computer-readable data 1106 in turn comprises a set of processor-executable instructions 1104 that when executed via a processing unit(s) is configured to operate according to one or more of the principles set forth herein. In some embodiments, the processor-executable instructions 1106 may be configured to perform an operation 1102, such as at least some of the example method 200 of FIG. 2, at least some of example method 800 of FIG. 8 and/or at least some of the example method 900 of FIG. 9, for example. In other embodiments, the processor-executable instructions 1104 may be configured to implement a system, such as at least some of the example system 1000 of FIG. 10, for example. Many such computer-readable media may be devised by those of ordinary skill in the art that are configured to operate in accordance with one or more of the techniques presented herein.

Figure 12:
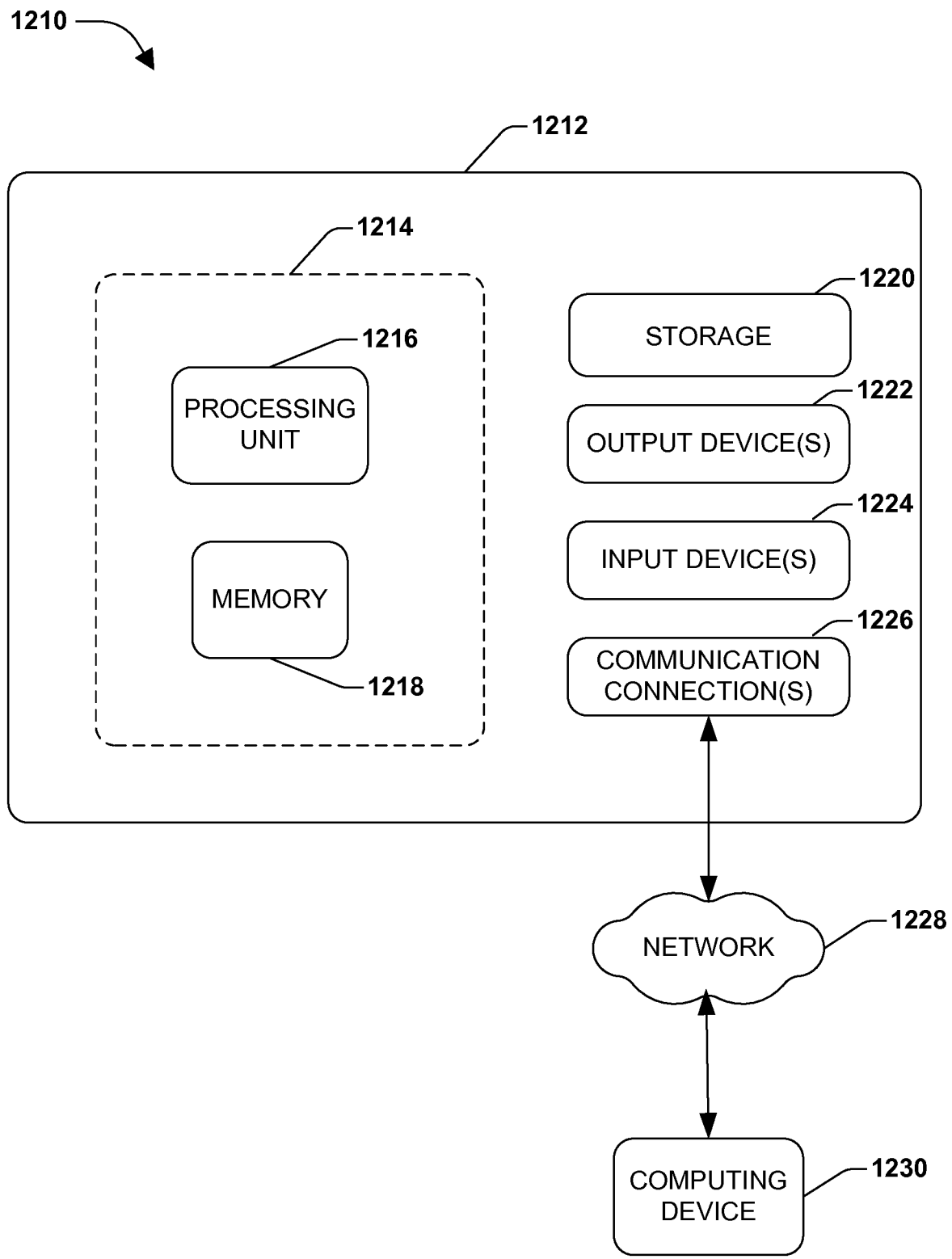
FIG. 12 illustrates an exemplary computing environment wherein one or more of the provisions set forth herein may be implemented.

FIG. 12 and the following discussion provide a brief, general description of a suitable computing environment to implement embodiments of one or more of the provisions set forth herein. The operating environment of FIG. 12 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 12 illustrates an example of a system 1210 comprising a computing device 1212 configured to implement one or more embodiments provided herein. In one configuration, computing device 1212 includes at least one processing unit 1216 and memory 1218. Depending on the exact configuration and type of computing device, memory 1218 may be volatile (such as RAM, for example), non-volatile (such as ROM, flash memory, etc., for example), or some combination of the two. This configuration is illustrated in FIG. 12 by dashed line 1214.

In other embodiments, device 1212 may include additional features and/or functionality. For example, device 1212 may also include additional storage (e.g., removable and/or non-removable) including, but not limited to, magnetic storage, optical storage, and the like. Such additional storage is illustrated in FIG. 12 by storage 1220. In one embodiment, computer readable instructions to implement one or more embodiments provided herein may be in storage 1220. Storage 1220 may also store other computer readable instructions to implement an operating system, an application program, and the like. Computer readable instructions may be loaded in memory 1218 for execution by processing unit 1216, for example.

The term "computer readable media" as used herein includes computer storage media. Computer storage media includes volatile and nonvolatile, removable and non-removable media implemented in any method or technology for storage of information such as computer readable instructions or other data. Memory 1218 and storage 1220 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 1212. Any such computer storage media may be part of device 1212.

Device 1212 may also include communication connection(s) 1226 that allows device 1212 to communicate with other devices. Communication connection(s) 1226 may include, but is not limited to, a modem, a Network Interface Card (NIC), an integrated network interface, a radio frequency transmitter/receiver, an infrared port, a USB connection, or other interfaces for connecting computing device 1212 to other computing devices. Communication connection(s) 1226 may include a wired connection or a wireless connection. Communication connection(s) 1226 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 1212 may include input device(s) 1224 such as keyboard, mouse, pen, voice input device, touch input device, infrared cameras, video input devices, and/or any other input device. Output device(s) 1222 such as one or more displays, speakers, printers, and/or any other output device may also be included in device 1212. Input device(s) 1224 and output device(s) 1222 may be connected to device 1212 via a wired connection, wireless connection, or any combination thereof. In one embodiment, an input device or an output device from another computing device may be used as input device(s) 1224 or output device(s) 1222 for computing device 1212.

Components of computing device 1212 may be connected by various interconnects, such as a bus. Such interconnects may include a Peripheral Component Interconnect (PCI), such as PCI Express, a Universal Serial Bus (USB), firewire (IEEE 1094), an optical bus structure, and the like. In another embodiment, components of computing device 1212 may be interconnected by a network. For example, memory 1218 may be comprised of multiple physical memory units located in different physical locations interconnected by a network.

Those skilled in the art will realize that storage devices utilized to store computer readable instructions may be distributed across a network. For example, a computing device 1230 accessible via a network 1228 may store computer readable instructions to implement one or more embodiments provided herein. Computing device 1212 may access computing device 1230 and download a part or all of the computer readable instructions for execution. Alternatively, computing device 1212 may download pieces of the computer readable instructions, as needed, or some instructions may be executed at computing device 1212 and some at computing device 1230.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Further, unless specified otherwise, "first," "second," and/or the like are not intended to imply a temporal aspect, a spatial aspect, an ordering, etc. Rather, such terms are merely used as identifiers, names, etc. for features, elements, items, etc. (e.g., "a first channel and a second channel" generally corresponds to "channel A and channel B," where channel A and channel B may be two different channels, two identical channels, or the same channel.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. Similarly, illustrated ordering(s) of acts is not meant to be limiting, such that different orderings comprising the same or different (e.g., numbers) of acts are intended to fall within the scope of the instant disclosure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
generating a first health profile of an industrial asset using a model comprising first data generated during an assessment period and indicative of the industrial asset, the first health profile comprising a maintenance plan providing one or more maintenance actions that are recommended to be performed with respect to the industrial asset during a maintenance period;
receiving second data generated during the maintenance period and indicative of the industrial asset;
updating the model wherein updating the model comprises:
adding the second data to the model responsive to identifying a pattern in the second data; and
responsive to the addition of the second data to the model and responsive to determining that a cost corresponding to resources required to acquire the first data is greater than a benefit corresponding to an improvement in at least one of accuracy or confidence of predictions associated with the model comprising the first data, removing the first data from the model to generate an updated model;
generating, using the updated model comprising the second data and not the first data, a second health profile of the industrial asset;

generating instructions to perform one or more actions associated with the industrial asset based upon the second health profile; and performing the one or more actions to maintain the industrial asset by implementing operational or physical changes to the industrial asset or to an interrelated system of the industrial asset.

2. The method of claim 1, wherein the second data generated during the maintenance period comprises a maintenance report describing zero or more maintenance actions performed during the maintenance period.

3. The method of claim 2, wherein the updating comprises comparing the zero or more maintenance actions performed during the maintenance period to the one or more maintenance actions recommended to be performed during the maintenance period.

4. The method of claim 1, further comprising generating a confidence profile describing at least one of an expected accuracy or an expected bias based upon the first data generated during the assessment period.

5. The method of claim 1, wherein the resources required to acquire the first data comprise at least one of visits or financial expenses.

6. The method of claim 1, wherein updating the model comprises adjusting a condition of the model associated with recommending a maintenance action responsive to determining that an impact associated with the maintenance action meets a threshold.

7. The method of claim 1, further comprising dividing a plurality of industrial assets into a first subset and a second subset, the first subset comprising the industrial asset, and wherein the updating comprises updating the model based upon information associated with the first subset of industrial assets.

8. The method of claim 1, wherein the updating comprises updating model logic of the model describing a process by which the first data generated during the assessment period is analyzed.

9. The method of claim 1, wherein the first health profile comprises a second maintenance plan providing one or more second maintenance actions that are recommended to be performed with respect to the industrial asset during the maintenance period.

10. A power system, comprising:
a plurality of industrial assets operationally connected to transfer power within the power system, the plurality of industrial assets including a first industrial asset; and
a maintenance system comprising a processor configured to receive information related to the first industrial asset, the maintenance system configured to:
generate a first health profile of the first industrial asset using a model comprising first data generated during an assessment period and indicative of the first industrial asset, the first health profile comprising a maintenance plan providing one or more maintenance actions that are recommended to be performed with respect to the first industrial asset during a maintenance period;
receive second data generated during the maintenance period and indicative of the first industrial asset; and
update the model by adding the second data to the model responsive to identifying a pattern in the second data, and, responsive to the addition of the second data to the model and responsive to determining that a cost corresponding to resources required to acquire the first data is greater than a benefit corresponding to an improvement in at least one of accuracy or confidence of predictions associated with the model comprising the first data, removing the first data from the model to generate an updated model.

11. The system of claim 10, wherein the assessment period is different than the maintenance period.

12. The system of claim 10, wherein the maintenance system is configured to update the model based upon at least one of an alignment or a discrepancy between the first health profile and the second data generated during the maintenance period.

13. The system of claim 10, wherein the second data generated during the maintenance period comprises a maintenance report describing zero or more maintenance actions performed during the maintenance period.

14. The system of claim 10, wherein the first health profile comprises a second maintenance plan providing one or more second maintenance actions that are recommended to be performed with respect to the first industrial asset during the maintenance period.

15. The system of claim 10, wherein the maintenance system is further configured to divide the plurality of industrial assets into a first subset and a second subset, the first subset comprising the first industrial asset.

16. The system of claim 15, wherein the maintenance system is further configured to re-divide the plurality of industrial assets into a third subset and a fourth subset based upon a comparison of the first health profile with the second data generated during the maintenance period and indicative of the first industrial asset, the third subset comprising the first industrial asset.

17. The system of claim 10, wherein the maintenance system is further configured to select the model, from a plurality of models, to be used to generate the first health profile.

18. The system of claim 17, wherein the maintenance system is configured to select a second model, from the plurality of models, to be used to generate a second health profile of the first industrial asset, based upon a comparison of the first health profile with the second data generated during the maintenance period and indicative of the first industrial asset.

19. The method of claim 1, wherein updating the model comprises updating a model parameter.

20. A method, comprising:
obtaining first data using sensors embedded within an industrial asset or external to the industrial asset or by performing a field test or inspection, the first data generated during an assessment period and indicative of the industrial asset during the assessment period;
generating a first health profile of the industrial asset using a model comprising the first data, the first health profile comprising a maintenance plan providing one or more maintenance actions that are recommended to be performed with respect to the industrial asset during a maintenance period;
obtaining second data using the sensors embedded within the industrial asset or external to the industrial asset or by performing a further field test or inspection, the second data generated during the maintenance period and indicative of the industrial asset during the maintenance period;
adding the second data to the model responsive to identifying a pattern in the second data; and
responsive to the addition of the second data to the model and responsive to determining that a cost corresponding to resources required to acquire the first data is greater than a benefit corresponding to an improvement in at least one of accuracy or confidence of predictions associated with the model comprising the first data, removing the first data from the model to generate an updated model;

generating a second health profile of the industrial asset using the updated model comprising the second data and not the first data; and generating instructions to perform one or more actions associated with the industrial asset based upon the second health profile so that the industrial asset can be maintained by implementing operational or physical changes.

21. The method of claim 20, wherein obtaining the first data comprises providing a maintenance report based on measurements or inspections at the industrial asset.

22. The method of claim 20, further comprising performing the one or more actions to maintain the industrial asset by implementing the operational or physical changes to the industrial asset or to an interrelated system of the industrial asset.

\* \* \* \* \*